(12) United States Patent
Neufeld et al.

(10) Patent No.: US 7,573,270 B2
(45) Date of Patent: Aug. 11, 2009

(54) RADIOFREQUENCY MAGNETIC FIELD RESONATOR AND A METHOD OF DESIGNING THE SAME

(75) Inventors: Arnon Neufeld, Tel-Aviv (IL); Menahem Levin, Ramat Gan (IL); Gil Navon, Ramat-Gan (IL)

(73) Assignee: Ramot at Tel Aviv University Ltd., Tel-Aviv (IL)

( * ) Notice: Subject to any disclaimer, the term of this patent is extended or adjusted under 35 U.S.C. 154(b) by 0 days.

(21) Appl. No.: 11/896,260

(22) Filed: Aug. 30, 2007

(65) Prior Publication Data

US 2008/0054904 A1  Mar. 6, 2008

Related U.S. Application Data

(62) Division of application No. 10/531,301, filed as application No. PCT/IL03/00826 on Oct. 12, 2003, now Pat. No. 7,298,145.

(60) Provisional application No. 60/437,452, filed on Jan. 2, 2003, provisional application No. 60/418,707, filed on Oct. 17, 2002.

(51) Int. Cl.
  *G01V 3/00* (2006.01)
(52) U.S. Cl. ..................... 324/318; 324/322
(58) Field of Classification Search .............. 324/318, 324/322
  See application file for complete search history.

(56) References Cited

U.S. PATENT DOCUMENTS

| | | | |
|---|---|---|---|
| 4,439,733 A * | 3/1984 | Hinshaw et al. | 324/322 |
| 4,506,224 A * | 3/1985 | Krause | 324/319 |
| 4,517,516 A | 5/1985 | Hill et al. | |
| 4,638,253 A | 1/1987 | Jaskolski et al. | |
| 4,654,592 A | 3/1987 | Zens | |
| 4,740,751 A | 4/1988 | Misic et al. | |
| 4,751,464 A * | 6/1988 | Bridges | 324/318 |
| 5,191,289 A | 3/1993 | Hayakawa et al. | |
| 5,467,017 A | 11/1995 | Duerr et al. | |

(Continued)

FOREIGN PATENT DOCUMENTS

WO  WO2004/036229  4/2004

OTHER PUBLICATIONS

Edelstein, "Radiofrequency System and coils for MRI and MRS", Methods in Biomedical Magnetic Resonance Imaging and Spectroscopy, 1: 135-157.

(Continued)

*Primary Examiner*—Louis M Arana

(57) ABSTRACT

A radiofrequency (RF) resonator for magnetic resonance analysis, the RF resonator comprising: (a) at least two conductive elements, each having a first curvature along a direction perpendicular to a longitudinal axis, the at least two conductive elements being spaced along the longitudinal axis, so that when an RF current flows within the at least two conductive elements in a direction of the longitudinal axis, a substantially homogenous RF magnetic field, directed perpendicular to the longitudinal axis, is produced in a volume defined between the at least two conductive elements. The RF resonator further comprises (b) an electronic circuitry designed and configured for providing predetermined resonance characteristics of the RF resonator, for matching an impedance of the RF resonator to an impedance of an RF transmitter electrically communicating with the electronic circuitry, and for balancing the RF magnetic field to have a substantially symmetrical profile with respect to a transverse axis being perpendicular to the longitudinal axis.

39 Claims, 23 Drawing Sheets

U.S. PATENT DOCUMENTS

| | | | |
|---|---|---|---|
| 6,377,044 | B1 | 4/2002 | Burl et al. |
| 6,429,656 | B2 | 8/2002 | Domalski |
| 6,437,567 | B1 | 8/2002 | Schenck et al. |
| 6,501,274 | B1 | 12/2002 | Ledden |
| 6,633,161 | B1 | 10/2003 | Vaughan |
| 2006/0012369 | A1 | 1/2006 | Neufeld et al. |

OTHER PUBLICATIONS

Belohrad et al. "Saddle Coil for MRI", p. 1-4.

Doty et al. "Practical Aspects of Birdcage Coils", Journal of Magnetic Resonance, 138: 144-154, 1999.

Doty et al. "Error-Tolerant RF Litz Coils for NMR/MRI", Journal of Magnetic Resonance, 140: 17-31, 1999.

Riauka et al. "A Numerical Approach to Non-Circular Birdcage RF Coil Optimization: Verification With a Fourth-Order Coil", Magnetic Resonance in Medicine, 41: 1180-1188, 1999.

Neufeld et al. "A Novel Imaging Coil—The Two Leg Birdcage(??) Bipod??Dipole??Boxer??", The Tel Aviv University School of Chemistry, p. 1-5.

Kost et al. "A Cylindrical-Window NMR Probe With Extended Tuning Range for Studies of the Developing Heart", Journal of Magnetic Resonance, 82: 238-252, 1989.

Martens et al. "Conformal Mapping Analyses of Microstrip Circular and Elliptical Cross-Sections", IEEE Transactions on Microwave Theory and Techniques, 40(9): 1836-1840, 1992.

Forbes et al. "Determining Current Distributions for RF Resonators in Magnetic Resonance Imaging", Meas. Sci. Technol., 6: 284-292, 1995.

Doty et al. "Copper-Clad Compensated Wire and Foil", p. 148-154.

Schneider et al. "Slotted Tube Resonator: A New NMR Probe Head at High Observing Frequencies", Rev. Sci. Instrum., 48(1): 68-73, 1977.

Carlson "Currents and Fields of Thin Conductors in RF Saddle Coils", Magnetic Resonance in Medicine, 3: 778-790, 1986.

Hammer et al. "Design of a13C{1H} RF Probe for Monitoring the In Vivo Metabolism of [1-13C] Glucose in Primate Brain", Magnetic Resonance in Medicine, 13: 1-5, 1990.

Hong et al. "Whole Body Slotted Tube Resonator (STR) for Proton NMR Imaging at 2.0 Tesla", Magnetic Resonance Imaging, 5: 239-243, 1987.

Bobroff et al. "Variations on the Slotted-Tube Resonator: Rectangular and Elliptical Coils", Magnetic Resonance Imaging, 17(5): 783-789, 1999.

Leroy-Willig et al. "The Slotted Cylinder. An Inductive Structure for NMR Imaging", Abstracts: Second Annual Meeting, p. 193-194.

Schneider et al. "Crossed Slotted Tube Resonator (CSTR)—A New Double Resonance NMR Probehead", Rev. Sci. Instrum., 48(7):832-833, 1977.

Sphicopoulos et al. "Slotted Tube Cavity: A Compact Resonator With Empty Core", IEE Proceedings, 134(Pt.H, 5): 405-410, 1987.

Murphy et al. "A Comparison of Three Radiofrequency Coils for NMR Studies of Conductive Samples", Magnetic Resonance in Medicine, 12: 382-389, 1989.

Barfuss et al. "In Vivo Magnetic Resonance Imaging and Spectroscopy of Humans With a 4T Whole-Body Magnet", NMR in Biomedicine, 3(1): 31-45, 1990.

Alderman et al. "An Efficient Decoupler Coil Design Which Reduces Heating in Conductive Samples in Superconducting Spectrometers", Journal of Magnetic Resonance, 36, 447-451, 1979.

Crozier et al. "In Vivo Localized 1 H NMR Spectroscopy at 11.7 Tesla", Journal of Magnetic Resonance, 94: 123-132, 1991.

Duerr et al. "Novel Electromagnetic Field Probes With Ultrasonic Transmission Lines for Field Measurements With Minimum Interaction", Rev.Sci. Instrum., 61(2):859-864, 1990.

Samaratunga et al. "Resonator Coils for Magnetic Resonance Imaging at 6 MHz", Med. Phys., 15(2): 235-240, 1988.

Cross et al. "Radiofrequency Resonators for High-Field Imaging and Double-Resonance Spectroscopy", Journal of Magnetic Resonance, 62: 87-98, 1985.

* cited by examiner

```
┌─────────────────────────────────────┐
│                72                   │
│  Applying a static magnetic field on the │
│              subject                │
└─────────────────────────────────────┘
                   │
┌─────────────────────────────────────┐
│                74                   │
│  Applying a substantially homogenous RF │
│      magnetic field on the subject  │
└─────────────────────────────────────┘
                   │
┌─────────────────────────────────────┐
│                76                   │
│   Acquiring nuclear magnetic resonance │
│       parameters from the object    │
└─────────────────────────────────────┘
```

Fig. 11

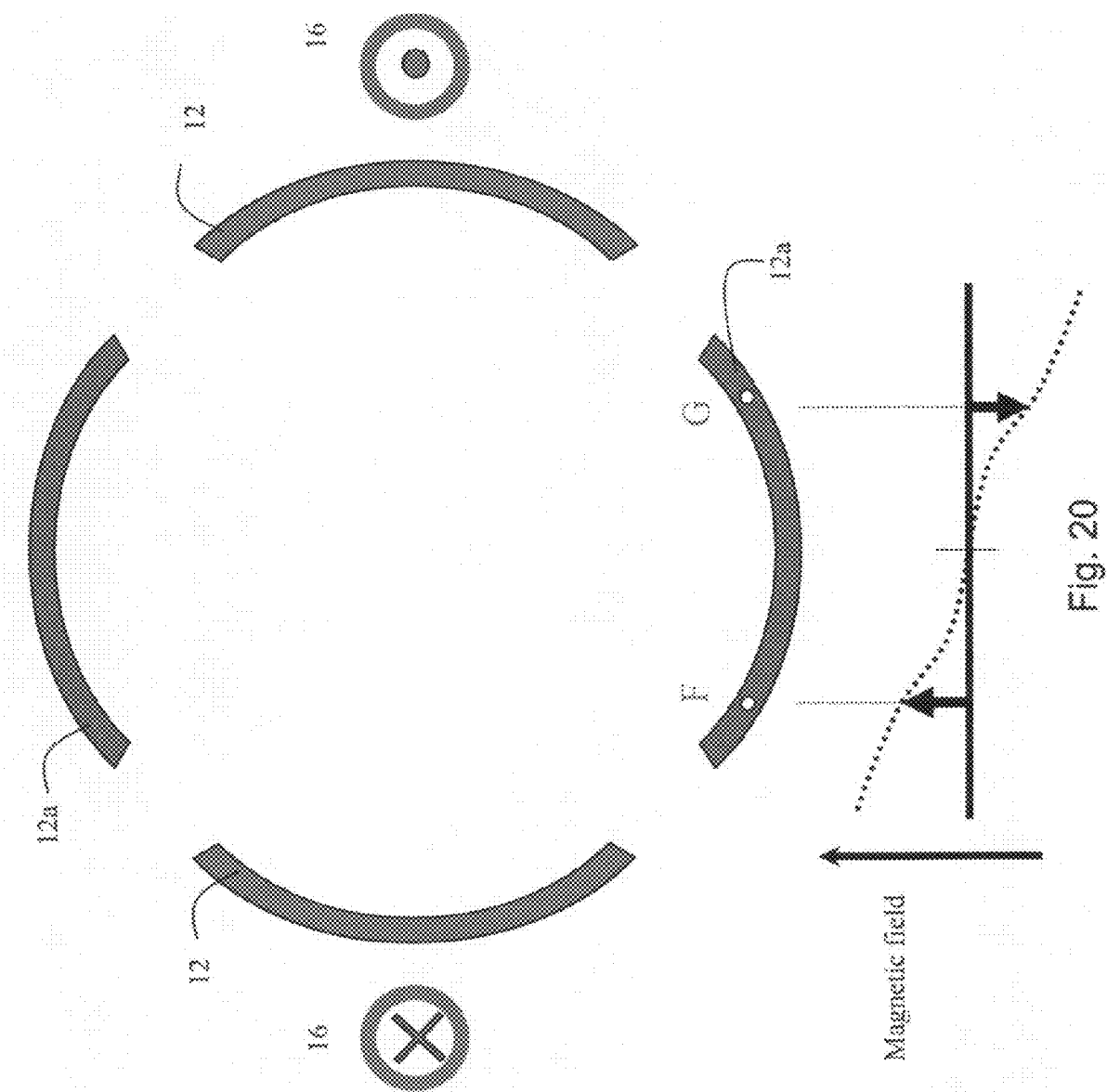

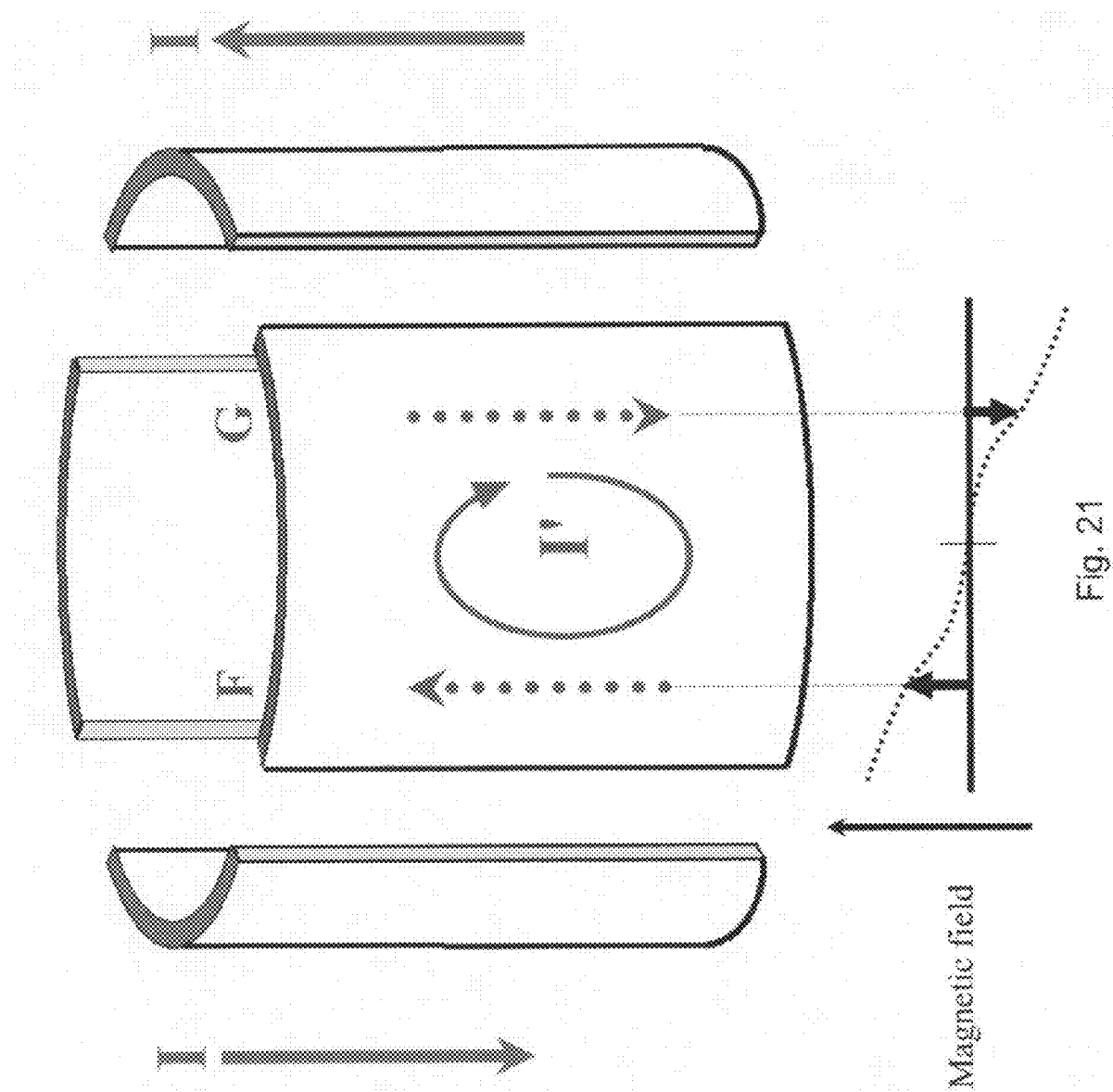

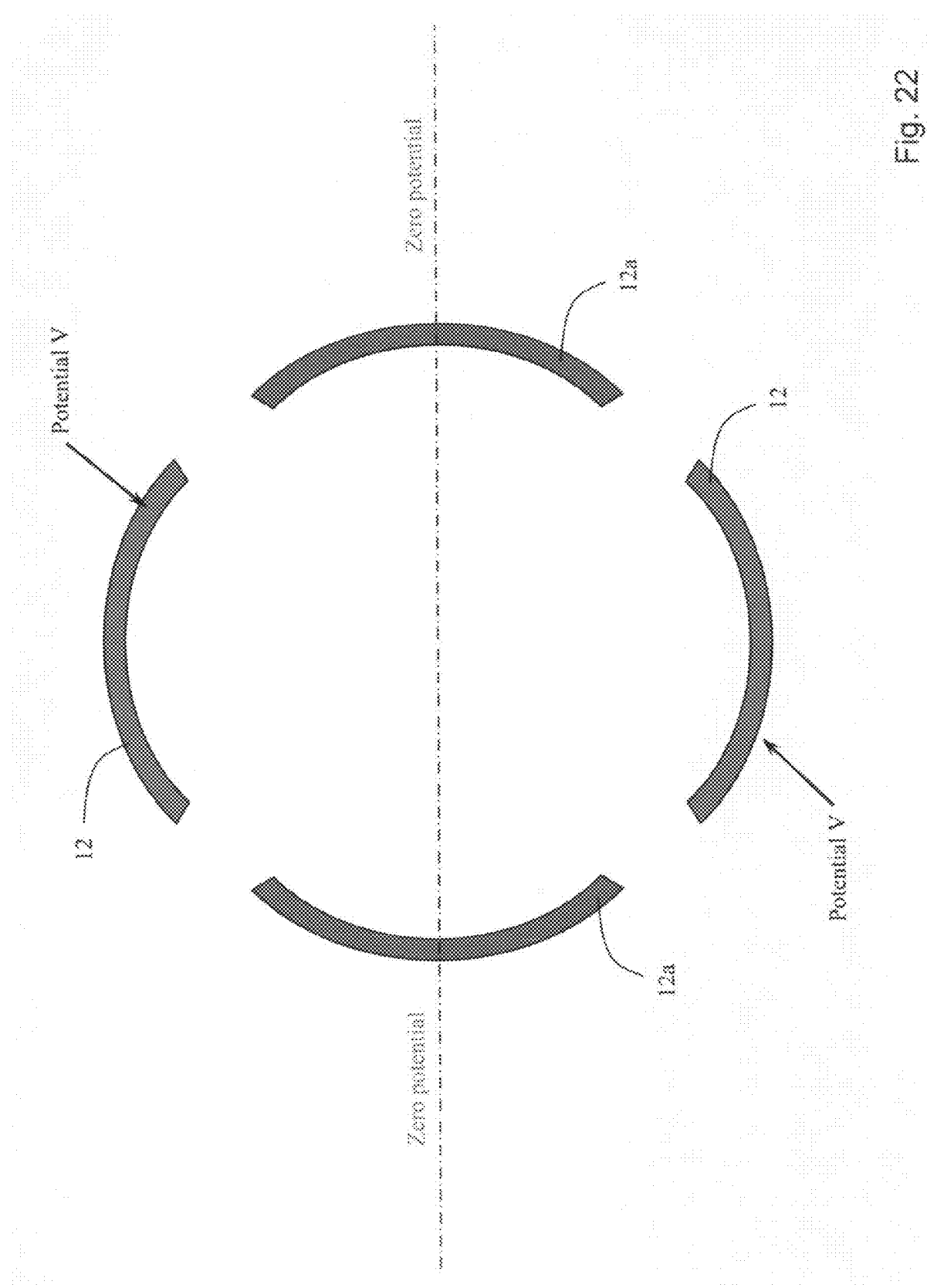

RADIOFREQUENCY MAGNETIC FIELD RESONATOR AND A METHOD OF DESIGNING THE SAME

RELATED PATENT APPLICATIONS

This application is a Divisional Application of U.S. patent application Ser. No. 10/531,301 filed Apr. 14, 2005, which is a National Phase Application of PCT Patent Application No. PCT/IL03/00826 having International Filing Date of Oct. 12, 2003, which claims the benefit of U.S. Provisional Patent Application No. 60/437,452 filed Jan. 2, 2003 and U.S. Provisional Patent Application No. 60/418,707 filed Oct. 17, 2002.The contents of the above Applications are all incorporated herein by reference.

FIELD AND BACKGROUND OF THE INVENTION

The present invention relates to magnetic resonance analysis and, more particularly, to a radiofrequency (RF) resonator for generating a substantially homogenous RF magnetic field for the purpose of magnetic resonance analysis. The present invention further relates to a method of designing the RF resonator, a magnetic resonance imaging (MRI) apparatus incorporating the RF resonator and a method of magnetic resonance analysis of an object.

MRI is a method to obtain an image representing the chemical and physical microscopic properties of materials, by utilizing a quantum mechanical phenomenon, known as Nuclear Magnetic Resonance (NMR), in which a system of spins, placed in a magnetic field resonantly absorb energy, when applied with a certain frequency.

A nucleus can experience NMR only if its nuclear spin is not zero, i.e., the nucleus has at least one unpaired nucleon. When placed in a magnetic field, a nucleus having a spin is allowed to be in a discrete set of energy levels, the number of which is determined by the spin, and the separation of which is determined by the gyromagnetic ratio of the nucleus and by the magnetic field. Under the influence of a small perturbation, manifested as an RF magnetic field, which rotates about the direction of a primary static magnetic field, the nucleus has a time dependent probability to experience a transition from one energy level to another. With a specific frequency of the rotating magnetic field, the transition probability may reach the value of unity. Hence at certain times, a transition is forced on the nucleus, although the rotating magnetic field may be of small magnitude relative to the primary static magnetic field. For an ensemble of nuclei the transitions are realized through a change in the overall magnetization.

Most MRI systems use a static magnetic field having a predetermined gradient, so that a unique magnetic field is generated at each region of the analyzed object. By detecting the NMR signal, knowing the magnetic field gradient, the position of each region of the object can be imaged. Typical MRI systems include a main magnet generating a uniform static magnetic field, whereas gradients in predetermined directions are obtained by providing additional coils which generate the desired gradients.

The rotating magnetic field in MRI systems is provided by an RF resonator, also known as RF coil, RF probe or RF antenna. The process of imaging or analyzing an object (e.g., a patient or a sample) is as follows. When pulse sequences are applied to the RF resonator, an RF radiation is emitted onto the object. According to the above principles, the RF radiation triggers NMR signals from the object from which information is obtained and subsequently used to reconstruct images and/or to analyze the object. In most MRI systems, the RF resonator is used both for transmitting the RF radiation and for detecting the resulting NMR signals from the object. RF resonators are required to generate a very uniform RF magnetic field, as any inhomogeneity in the RF magnetic field causes identical spins at different locations within the imaged object to respond differently to the RF radiation thereby distorting the image or negatively affecting the quality of the analysis. It is recognized that RF resonators which generate inhomogeneous magnetic fields also have inhomogeneous sensitivity and that RF resonators generating a weak magnetic field also detect weak NMR signals.

In addition to the homogeneity requirement, the RF magnetic field generated by the RF resonator is required to have a resonance frequency which matches the resonance frequency of the nuclear spins in the imaged sample. A known phenomenon is that once a sample is inserted into the RF magnetic field, the resonance frequency is shifted. Thus, RF resonators are typically equipped with appropriate circuitries which tune and rematch the resonance frequencies of the RF resonator and the sample. To increase signal-to-noise-ratio (SNR) and to optimize the efficiency of the system, it is also desirable that the size of the RF resonator will be comparable to the size of the sample.

Many RF resonators are presently known, and can be categorized into two groups, commonly referred to as the group of surface resonators and the group of volume resonators.

FIG. 1 illustrates a surface resonator, known as the single-loop coil [M. R. Bendall, "Surface Coil Technology", *Magnetic Resonance Imaging*, ed. by C. L. Partain et al., Philadelphia, 1988]. The single-loop coil is a planar current-loop, which is sensitive to RF fields, designated herein by $B_1$, in the direction perpendicular to the loop surface. The single-loop coil is characterized by a high SNR, however, its effective homogenous RF field is only near the surface, or the plane, of the current-loop. Thus, the single-loop coil is highly inhomogeneous.

FIG. 2 illustrates another surface RF resonator, known as the phased array coil [Sodickson D K and Manning W J., "Simultaneous acquisition of spatial harmonics (SMASH): ultra-fast imaging with RF coil arrays", *Proc. Fifth Scientific Meeting of the International Society for Magnetic Resonance in Medicine*, 1817 (1997); Klass P. Pressmann, et al., "SENSE: Sensitivity Encoding for fast MRI", *Magnetic Resonance in Medicine*, 42:952, 1999]. The phased array coil is an array of a number of single-loop coils, where the phases of the single-loop coils are designed so that the matrix representing their signals is can be diagonalized. The volume of interest of the phased array coil is the combined near-surface of each single unit of the array.

As opposed to the surface resonators, where the effective imaged region is a surface (i.e., two-dimensional space), in the group of volume resonators the effective imaged region is a volume (three-dimensional space). FIG. 3 illustrates a volume RF resonator known as a saddle coil [D. W. Alderman et al., *J. Magn. Reson.* 36, 447, 1979]. The saddle coil is made of a combination of two current-loops, wrapped around a lateral surface area of a cylinder, so that the magnetic fields of the two current-loops combine. In some saddle coils each loop is made a multi-loop structure in a spiral manner.

FIG. 4 illustrates another volume RF resonator known as the multi-turn solenoid [D. I. Hoult and P. C. Lauterbour, J., "The Sensitivity of Zeugmatographic Experiment Involving Human Samples" *Magn. Reson,* 34:425, 1979 ]. The multi-turn solenoid is a structure which generates a very homogenous magnetic field within a cylindrical volume. The multi-turn solenoid is rarely used in MRI because the magnetic field is parallel to the cylinder axis and is therefore orthogonal to the symmetry of clinical systems where the RF field is to be orthogonal to the longitudinally oriented main static magnetic field.

FIG. 5 illustrate an additional volume RF resonator known as the single-turn solenoid [J. P. Hornak, et al., "Elementary Single Turn Solenoids Used in the Transmitter and Receiver in Magnetic Resonance Imaging", *Magn. Reson. Imag.*, 5:233-237, (1987)]. The single-turn solenoid formed by a broad sheet instead of a multi-turn structure. Conceptually, it is very similar to the conventional solenoid, thus, it suffers from similar limitations as the multi-turn solenoid and it is therefore used only for imaging of particular samples, such as the breast and forearm. One type of single-turn solenoid is the perforated single-turn solenoid which is a single-turn solenoid with one or more perforations in its cylinder. The perforated single-turn solenoid is suitable for imaging of head, knee, elbow, wrist and shoulder.

FIG. 6 illustrates the most common volume RF resonator for clinical imaging, known as the birdcage resonator or the birdcage coil [C. E. Hayse et al., "An Efficient Highly Homogeneous Radiofrequency Coil for Whole-Body NMR Imaging at 1.5 T", *J. Magn. Reson.*, 63:622-628, 1985; J. Tropp, "The theory of the bird-cage resonator", *J. Magn. Reson.* 1989; 82, 51-62; T. A. Riauka el al., "A numerical approach to non-circular birdcage RF coil optimization: Verification with a fourth-order coil", *Magnetic Resonance in Medicine*, 41:1180-1188, 1999; Jianming J. "Electromagnetic analysis and design in magnetic resonance imaging", CRC Press, New York, 1999]. The birdcage coil is a very homogenous resonator which is formed from a number of equally spaced conductors on a cylindrical surface. It is common to refer to conductors which are longitudinally oriented with respect to the symmetry axis of the cylinder as "legs" or "rungs", and to conductors which are transversally oriented as "end-rings". Capacitors are located on the legs, on the end-rings or both on the legs and the end-rings.

Currents flowing in the legs and end-rings obey an eigenvalue equation which is characterized by a set of eigenvectors, also known as current-modes. Each current-mode corresponds to a set of currents flowing in the legs, and is associated to an eigenvalue which is related to one possible solution of resonant frequency. Specifically, a birdcage coil with N legs has N resonant frequencies and N current-modes. For a linear birdcage, one special current-mode, has a sinusoidal current distribution among the legs of each side along the circumference. In this mode, the magnetic field inside the resonator is very homogenous. In is known that the homogeneity level of the field is proportional to the number of legs, where an infinite number of legs incorporate a desired mode corresponding to an RF field having a perfect homogeneity.

However, as the number of current-modes increases, so does the complexity of the birdcage coil design. The undesired current-modes of the birdcage coil, except for intrinsically orthogonal cosine mode, reduce the field homogeneity and/or the transmission and detection power. Thus, when designing a birdcage coil, one needs to eliminate all current-modes other then the desired mode to ensure a homogenous field. This is typically done by designing a birdcage coil where the desired mode resonant frequency is significantly spaced apart from all the other frequencies. An additional factor which is to be considered when selecting the number of birdcage coil legs is the physiological effect of a large number of legs on the patient which may become claustrophobic.

An inherent limitation of the birdcage coil is that in the design process, both the magnetic field characteristic and the resonance characteristic of the birdcage coil are to be simultaneously calculated, as these two characteristics are entangled. Any change in the number of legs and separation therebetween and the location of the capacitors and the type thereof alters both the RF field lines and the resonant frequency of the coil.

Moreover, the simulations preceding the manufacturing of the birdcage coil exhibits a very homogenous RF magnetic field. In practice, however, once a sample is inserted into the coil, the resonance frequency and the tuning impedance of the coil are shifted. Although this effect can be approximated during simulation, the validity of such approximation is very limited due to the various sizes, structures and orientations that a biological organ may exhibit when placed in the birdcage coil, contrary to the spherical or cylindrical uniform sample that is typically used for simulations. Thus, the resonance frequency and the tuning impedance must be retuned by an arrangement of tunable capacitors, which has to be electrically connected to the birdcage coil. Theoretically, N tunable capacitors can correct some of the sample effects, but for practical reasons only a few capacitors are used. The additional capacitors break the symmetry of the birdcage coil, result in loosing field homogeneity and introduce non-zero contributions from one or more undesired current-modes. In realistic birdcage coils, the inhomogeneity of the RF field may approach 15-20%.

Additional prior art of relevance is a volume RF resonator known as the Litz coil, disclosed in U.S. Pat. No. 6,060,882 and illustrated in FIG. 7. The coil is based on Litz foil conductor, which includes multiple and parallel Litz wires with interwoven sub-routes from a first node to a second node and insulated crossovers forming well-defined flux sub-windows. The structure of the coil results in multiple current routes each contribute to the RF magnetic field, $B_1$, leaving a central flux window centered on the $B_1$ axis. An identical semi-coil, formed on the opposite side of the sample around completes the coil. The two semi-coils are electrically connected in parallel. This coil solves some of the problems associated with the birdcage coil, however its design and manufacturing is still rather complicated. Specifically, the Litz coil efficiency depends on the number of braids and on their thickness. Hence, for a sufficiently efficient Litz coil the braiding is very complex and ultra thin.

Also of prior art of relevance is the so-called "Slotted Tube Resonator" [H. J. Schneider and P. Dullenkopf, "Slotted Tube Resonator: A new NMR probe head at high observing frequencies", *Rev. Sci. Instrum.*, 48:68-73, 1977]. This resonator is composed of a conducting tube which is cut lengthwise, thereby forming a strip line which consists of two arched conductors. The slotted tube resonator is coupled to an electronic circuitry, which includes two independently operating capacitors, a series capacitor for matching the resonant characteristics of the resonator and a shunting capacitor for tuning the impedance of the resonator.

An improved type of the slotted tube resonator [D. H. Hong et al., "Whole Body Slotted Tube Resonator for Proton NMR Imaging at 2.0 Tesla", *Magn. Res. Imag.*, 5:239-243, 1987;], incorporates a coupling sheet, positioned externally to the tube arches, for linking the resonator with the transmitter and/or the receiver of the imaging system. In addition, the improved slotted tube resonator includes additional capacitors forming a capacity coupling between the two tube arches.

One application of the slotted tube resonator, designed specifically for analyzing hearts of rabbits of different sizes, is described in G. J. Kost, "A Cylindrical-Window NMR Probe with Extended Tuning Range Studies of the Developing Heart", *J. Magn. Res.* 82:238-252, 1989. This coil is cylindrical and it is formed with a window in the cylinder wall. Unlike the multi- and single-turn solenoids, the produced magnetic field of the cylindrical windowed coil is directed perpendicularly to the symmetry axis of the cylinder. This coil, however, is suitable only for non-imaging applications of small sized samples.

Other slotted tube resonators are described in S. Bobroff and M. J. McCarthy, "Variations on the Slotted-Tube Resonator: Rectangular and Elliptical Coils", *Magn. Res. Imag.,* 17:783-789, 1999; M. K. Murphy et al., "A Comparison of Three Radiofrequency Coils for NMR Studies of Conductive Samples", *Magn. Res. in Med.,* 12:382-389, 1989; T. Sphicopoulos and F. Gardiol, "Slotted Tube Cavity: a Compact Resonator With Empty Core", *IEE Proceedings,* 134:405-410; A. Darrasse et al., "The slotted cylinder: an efficient probe for NMR imaging, *Magnetic Resonance in Medicine,* 2(1):20-8, 1985; H. J. Schneider and P. Dullenkopf, "Crossed Slotted Tube Resonator: A new Double resonance NMR probehead", *Rev. Sci. Instrum.,* 48:832-834, 1977; D. W. Alderman and D. M. Grant, "An Efficient Decoupler Coil Design which Reduces Heating in Conductive Samples in Superconducting Spectrometers", *J. Magn. Res.,* 36:447-451, 1979; S. Crozier et al., "In Vivo Localized $^1$H NMR Spectroscopy at 11.7 Tesla", *J. Magn. Res.,* 94:123-132, 1991; C. Ranasinghage et al., "Resonator Coils for magnetic resonance imaging at 6 MHz", *Med. Phys.* 15:235-240, 1988; and T. A. Gross et al., "Radiofrequency Resonators for High-Field Imaging and Double-Resonance Spectroscopy", *J. Magn. Res.,* 62:87-98, 1985.

It will be appreciated that, all of the prior art slotted tube resonators suffer from two crucial limitations: (i) the slotted tube resonator fails to provide a mechanism for balancing the RF field homogeneity once it has deviated from its original design due to sample-field interactions; and (ii) the geometrical configuration of the slotted tube resonator is such that the generated RF magnetic field has a linear polarization. An intrinsic limitation of the linear polarization is the power losses, which are explained by wasted components in the mathematical expansion of the linear polarization. In a theoretical study of current distributions and field uniformity in saddle coils [J. W. Carlson, "Currents and Fields of Thin Conductors in RF Saddle Coils", *Magn. Res. in Med.,* 3:778-790, (1986)] an optimal geometry for circular polarized coil has been calculated.

In this respect, one coil for generating a circular polarized magnetic field is of the birdcage type described above, also known as the quadrature birdcage coil, in which intrinsically orthogonal sine and cosine modes are incorporated. A particularly interesting quadrature birdcage coil is described in an article by H. Barfuss et al., entitled "In Vivo Magnetic Resonance Imaging and Spectroscopy of Humans with a 4 T Whole-body Magnet", published in *NMR in Biomedicine,* 3:31-45. This birdcage coil consists of four longitudinal and two transverse copper foils, interconnected via a system of capacitors. The coil is further equipped with additional rotary differential capacitors for providing continuous distribution between the tuning and matching capacitors, thereby allowing variation of the quality factor of the coil. However, this birdcage coil only partially addresses to problems associated with effects of interaction between the magnetic field and the imaged object. Specifically, this birdcage coil, although successfully providing a sophisticated circuitry for tuning the resonance characteristics and matching the impedance, fails to provide a satisfactory mechanism for correcting inhomogeneity in the magnetic field once a sample is placed therein.

There is thus a widely recognized need for, and it would be highly advantageous to have, an RF resonator and a method of designing the same, devoid of the above limitations.

SUMMARY OF THE INVENTION

According to one aspect of the present invention there is provided a radiofrequency (RF) resonator for magnetic resonance analysis, the RF resonator comprising: (a) at least two conductive elements, each having a first curvature along a direction perpendicular to a longitudinal axis, the at least two conductive elements being spaced along the longitudinal axis, so that when an RF current flows within the at least two conductive elements in a direction of the longitudinal axis, a substantially homogenous RF magnetic field, directed perpendicular to the longitudinal axis, is produced in a volume defined between the at least two conductive elements; and (b) an electronic circuitry designed and configured for providing predetermined resonance characteristics of the RF resonator, for matching an impedance of the RF resonator to an impedance of an RF transmitter electrically communicating with the electronic circuitry, and for balancing the RF magnetic field to have a substantially symmetrical profile with respect to a transverse axis being perpendicular to the longitudinal axis.

According to another aspect of the present invention there is provided a method of designing a radiofrequency (RF) resonator for magnetic resonance analysis, the method comprising: (a) selecting at least two surfaces to engage at least two conductive elements, the at least two surfaces having a first curvature along a direction perpendicular to a longitudinal axis, thereby defining a geometry between the at least two surfaces; (b) using the geometry for calculating a magnetic field within the ; (c) iteratively repeating the steps (a) and (b) so as to provide optimized geometry corresponding to a substantially homogenous magnetic field; and (d) using the optimized geometry and the substantially homogenous magnetic field for designing an electronic circuitry for providing predetermined resonance characteristics of the RF resonator, for matching an impedance of the RF resonator to an impedance of an RF transmitter electrically communicating with the electronic circuitry, and for balancing the RF magnetic field to have a substantially symmetrical profile with respect to a transverse axis being perpendicular to the longitudinal axis.

According further features in the preferred embodiments described below, the matching is by varying mutual capacitance.

According to still further features in the described preferred embodiments the matching is by varying mutual inductance.

According to still further features in the described preferred embodiments the calculating the magnetic field within the geometry is by solving Maxwell's equations.

According to still further features in the described preferred embodiments the calculating the magnetic field within the geometry is by finite element method.

According to still further features in the described preferred embodiments the calculating the magnetic field within the geometry is by moments analysis method.

According to still further features in the described preferred embodiments the method further comprising designing an RF shield for minimizing electromagnetic interactions between the RF resonator and at least one gradient coil and/or between the RF resonator and a device for providing a static magnetic field.

According to still further features in the described preferred embodiments the designing an RF shield is by the method of images.

According to still further features in the described preferred embodiments the method further comprising designing at least one end-cap to be positioned adjacent to at least one end of the RF resonator for minimizing magnetic field inhomogeneities along the longitudinal axis.

According to still further features in the described preferred embodiments the method further comprising designing at least one additional conductive element, so as to further minimize inhomogeneity of the magnetic field.

According to still further features in the described preferred embodiments a phase of an RF current flowing through the at least one additional conductive element equals a phase of currents flowing through the at least two conductive elements.

According to still further features in the described preferred embodiments an RF current flowing through the at least one additional conductive element depends on currents flowing through the at least two conductive elements, through a predetermined function.

According to still further features in the described preferred embodiments an RF current flowing through the at least one additional conductive element is a predetermined fraction of currents flowing through the at least two conductive elements.

According to yet another aspect of the present invention there is provided an apparatus for magnetic resonance analysis, the apparatus comprising: (a) a device for providing a static magnetic field; (b) a processing unit; and (c) an RF resonator coupled to an RF transmitter, the RF resonator comprising: at least two conductive elements, each having a first curvature along a direction perpendicular to a longitudinal axis, the at least two conductive elements being spaced along the longitudinal axis, so that when an RF current flows within the at least two conductive elements in a direction of the longitudinal axis, a substantially homogenous RF magnetic field, directed perpendicular to the longitudinal axis, is produced in a volume defined between the at least two conductive elements; and an electronic circuitry designed and configured for providing predetermined resonance characteristics of the RF resonator, for matching an impedance of the RF resonator to an impedance of the RF transmitter, and for balancing the RF magnetic field to have a substantially symmetrical profile with respect to a transverse axis being perpendicular to the longitudinal axis.

According to still another aspect of the present invention there is provided a method for Magnetic Resonance analysis of an object, the method comprising: applying a static magnetic field on the subject in a direction of a longitudinal axis; applying a substantially homogenous RF magnetic field on the subject, in a direction perpendicular to the longitudinal axis; and acquiring nuclear magnetic resonance parameters from the object, thereby analyzing the object; wherein the applying the substantially homogenous RF magnetic field is by a RF resonator coupled to an RF transmitter, the RF resonator comprising: at least two conductive elements, each having a first curvature along a direction perpendicular to the longitudinal axis, the at least two conductive elements being spaced along the longitudinal axis, so that when an RF current flows within the at least two conductive elements in a direction of the longitudinal axis, the substantially homogenous RF magnetic field, is produced in a volume defined between the at least two conductive elements; and an electronic circuitry designed and configured for providing predetermined resonance characteristics of the RF resonator, for matching an impedance of the RF resonator to an impedance of an RF transmitter electrically communicating with the electronic circuitry, and for balancing the RF magnetic field to have a substantially symmetrical profile with respect to a transverse axis being perpendicular to the longitudinal axis.

According to further features in the preferred embodiments described below, the method further comprising balancing the RF magnetic field using a balancing adjuster electrically communicating with the electronic circuitry.

According to still further features in the described preferred embodiments the RF resonator further comprising at least one additional conductive element positioned so as to further minimize inhomogeneity of the magnetic field.

According to still further features in the described preferred embodiments a phase of an RF current flowing through the at least one additional conductive element equals a phase of the RF current flowing through the at least two conductive elements.

According to still further features in the described preferred embodiments the RF resonator is characterized by two phases of RF currents, the two phases differ by 180 degrees.

According to still further features in the described preferred embodiments the method further comprising applying at least one gradient pulse on the object.

According to still further features in the described preferred embodiments a separation between the at least two conductive elements is selected so as to surround the object.

According to still further features in the described preferred embodiments the method further comprising preserving the at least two conductive elements at a sufficiently low temperature.

According to still further features in the described preferred embodiments the applying the substantially homogenous RF magnetic field is by at least one additional RF resonator.

According to still further features in the described preferred embodiments the at least one additional RF resonator is arranged with the RF resonator to form an RF resonator array.

According to still further features in the described preferred embodiments the method further comprising electrically decoupling the RF resonator from the at least one additional RF resonator.

According to still further features in the described preferred embodiments the method further comprising electromagnetically decoupling the RF resonator from the at least one additional RF resonator.

According to still further features in the described preferred embodiments each of the at least two conductive elements has a predetermined capacitance distribution for minimizing effects of the object on the magnetic field and for minimizing corona discharge from the at least two conductive elements.

According to an additional aspect of the present invention there is provided an RF resonator for magnetic resonance analysis, the RF resonator comprising: (a) at least two conductive elements, each having a first curvature along a direction perpendicular to a longitudinal axis, the at least two conductive elements being spaced along the longitudinal axis, so that when an RF current flows within the at least two conductive elements in a direction of the longitudinal axis, a substantially homogenous RF magnetic field, directed perpendicular to the longitudinal axis, is produced in a volume defined between the at least two conductive elements; and (b) at least one additional conductive element, electrically communicating with the at least two conductive elements in a manner such that a phase of an RF current flowing through the at least one additional conductive element equals a phase of at least one of the RF currents flowing through the at least two conductive elements.

According to further features in the preferred embodiments described below, the RF resonator further comprising an electronic circuitry designed and configured for providing predetermined resonance characteristics of the RF resonator, for matching an impedance of the RF resonator to an impedance of an RF transmitter electrically communicating with the electronic circuitry, and for balancing the RF magnetic field to have a substantially symmetrical profile with respect to a transverse axis being perpendicular to the longitudinal axis.

According to still further features in the described preferred embodiments the RF resonator further comprising means for preserving the at least two conductive elements at a sufficiently low temperature.

According to yet an additional aspect of the present invention there is provided an apparatus for magnetic resonance analysis, the apparatus comprising: (a) a device for providing a static magnetic field; (b) a processing unit; and (c) an RF resonator coupled to an RF transmitter, the RF resonator comprising: at least two conductive elements, each having a first curvature along a direction perpendicular to a longitudinal axis, the at least two conductive elements being spaced along the longitudinal axis, so that when an RF current flows within the at least two conductive elements in a direction of the longitudinal axis, a substantially homogenous RF magnetic field, directed perpendicular to the longitudinal axis, is produced in a volume defined between the at least two conductive elements; and at least one additional conductive element, electrically communicating with the at least two conductive elements in a manner such that a phase of an RF current flowing through the at least one additional conductive element equals a phase of at least one of the RF currents flowing through the at least two conductive elements.

According to further features in the preferred embodiments described below, the RF resonator further comprising an electronic circuitry designed and configured for providing predetermined resonance characteristics of the RF resonator, for matching an impedance of the RF resonator to an impedance of the RF transmitter, and for balancing the RF magnetic field to have a substantially symmetrical profile with respect to a transverse axis being perpendicular to the longitudinal axis.

According to still further features in the described preferred embodiments the RF resonator further comprising a balancing adjuster electrically communicating with the electronic circuitry, the balancing adjuster is constructed and designed for controlling the electronic circuitry while the RF resonator is in medical use.

According to still further features in the described preferred embodiments an RF current flowing through the at least one additional conductive element depends on the RF currents flowing through the at least two conductive elements, through a predetermined function.

According to still further features in the described preferred embodiments the predetermined function is selected from the group consisting of a linear function, a polynomial function, an exponential function, a rational function, a power function and any combination thereof.

According to still further features in the described preferred embodiments an RF current flowing through the at least one additional conductive element is a predetermined fraction of the RF currents flowing through the at least two conductive elements.

According to still further features in the described preferred embodiments the predetermined fraction is one half.

According to still further features in the described preferred embodiments the device for providing the static magnetic field comprises at least one shim coil.

According to still further features in the described preferred embodiments the apparatus further comprising at least one gradient coil.

According to still further features in the described preferred embodiments the apparatus further comprising an RF shield constructed and designed for minimizing electromagnetic interactions between the at least one gradient coil and the device for providing a static magnetic field.

According to still further features in the described preferred embodiments the apparatus further comprising at least one end-cap positioned adjacent to at least one end of the RF resonator, the at least one end-cap constructed and designed for minimizing magnetic field inhomogeneities along the longitudinal axis.

According to still further features in the described preferred embodiments the RF resonator is coupled to the RF transmitter via a transmission line.

According to still further features in the described preferred embodiments the RF resonator is coupled to the RF transmitter via an RF antenna.

According to still further features in the described preferred embodiments the electronic circuitry comprises means for varying mutual capacitance.

According to still further features in the described preferred embodiments the electronic circuitry comprises means for varying mutual inductance.

According to still further features in the described preferred embodiments the mutual inductance is defined between the RF resonator and the RF transmitter.

According to still further features in the described preferred embodiments the mutual inductance is defined between the electronic circuitry and the RF transmitter.

According to still further features in the described preferred embodiments the electronic circuitry comprises an arrangement of capacitors, inductors, tunable capacitors and tunable inductors.

According to still further features in the described preferred embodiments the capacitors and the tunable capacitors are high power capacitors.

According to still further features in the described preferred embodiments the high power capacitors are vacuum capacitors.

According to still further features in the described preferred embodiments a longitudinal dimension of the at least two conductive elements is selected so as to minimize magnetic field inhomogeneities along the longitudinal axis.

According to still further features in the described preferred embodiments a separation between the at least two conductive elements is selected so as to surround an object to be imaged.

According to still further features in the described preferred embodiments the object is a mammal.

According to still further features in the described preferred embodiments the object is an organ of a mammal.

According to still further features in the described preferred embodiments the object is a tissue.

According to still further features in the described preferred embodiments the object is a swollen elastomer.

According to still further features in the described preferred embodiments the object is a food material.

According to still further features in the described preferred embodiments the object is liquid.

According to still further features in the described preferred embodiments the object is at least one type of molecules present in the solvent.

According to still further features in the described preferred embodiments the at least one type of molecules present in the solvent is selected from the group consisting of molecule dissolved in the solvent, a molecule dispersed in the solvent and a molecule emulsed in the solvent.

According to still further features in the described preferred embodiments the first curvature is selected from the group consisting of a curvature of cylinder, a curvature of an ellipsoid, a curvature of a hyperboloid, a curvature of a paraboloid and a curvature of an irregular surface.

According to still further features in the described preferred embodiments at least one of the at least two conductive elements further has a second curvature along a direction parallel to the longitudinal axis.

According to still further features in the described preferred embodiments the first curvature and the second curvature are each independently constant curvatures.

According to still further features in the described preferred embodiments the first curvature and the second curvature are each independently variable curvatures.

According to still further features in the described preferred embodiments the second curvature is selected from the group consisting of a curvature of cylinder, a curvature of an ellipsoid, a curvature of a hyperboloid, a curvature of a paraboloid and a curvature of an irregular surface.

According to still further features in the described preferred embodiments a number of the at least two conductive elements is selected so that the substantially homogenous RF magnetic field is linearly polarized.

According to still further features in the described preferred embodiments a number of the at least two conductive elements is selected so that the substantially homogenous RF magnetic field is substantially circularly polarized.

According to still further features in the described preferred embodiments the at least two conductive elements are two conductive elements.

According to still further features in the described preferred embodiments the at least two conductive elements are four conductive elements.

According to still further features in the described preferred embodiments a first pair of the four conductive elements is magnetically decoupled from a second pair of the four conductive elements.

According to still further features in the described preferred embodiments a first pair of the four conductive elements is electrically decoupled from a second pair of the four conductive elements.

According to still further features in the described preferred embodiments a first pair of the four conductive elements is electromagnetically decoupled from a second pair of the four conductive elements.

According to still further features in the described preferred embodiments a first pair and a second pair of the four conductive elements are positioned so that a transverse axis of the first pair is substantially perpendicular to a transverse axis of the second pair.

According to still further features in the described preferred embodiments the at least two conductive elements are made of a superconducting material.

According to still further features in the described preferred embodiments the apparatus further comprising means for preserving the at least two conductive elements at a sufficiently low temperature.

According to still further features in the described preferred embodiments the apparatus further comprising at least one additional RF resonator arranged with the RF resonator to form an RF resonator array.

According to still further features in the described preferred embodiments the apparatus further comprising decoupling means for decoupling the RF resonator from the at least one additional RF resonator.

According to still further features in the described preferred embodiments the apparatus further comprising decoupling means for decoupling the RF resonator from the at least one gradient coil.

According to still further features in the described preferred embodiments the decoupling means comprise DC block capacitors.

According to still further features in the described preferred embodiments the array is a phased array.

According to still further features in the described preferred embodiments the RF resonator is a multi frequency RF resonator.

According to still further features in the described preferred embodiments each of the at least two conductive elements has a predetermined capacitance distribution for minimizing effects of an object to be imaged on the magnetic field and for minimizing corona discharge from the at least two conductive elements.

According to still further features in the described preferred embodiments the at least two conductive elements are designed and constructed to minimize eddy currents generated therein.

According to still further features in the described preferred embodiments the at least two conductive elements are characterized by an RF shield structure, for substantially blocking RF radiation while transmitting low frequency radiation.

The present invention successfully addresses the shortcomings of the presently known configurations by providing an RF resonator and a method of designing an RF resonator, which enjoy properties far exceeding the prior art.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

Implementation of the method and system of the present invention involves performing or completing selected tasks or steps manually, automatically, or a combination thereof. Moreover, according to actual instrumentation and equipment of preferred embodiments of the method and system of the present invention, several selected steps could be implemented by hardware or by software on any operating system of any firmware or a combination thereof. For example, as hardware, selected steps of the invention could be implemented as a chip or a circuit. As software, selected steps of the invention could be implemented as a plurality of software instructions being executed by a computer using any suitable operating system. In any case, selected steps of the method and system of the invention could be described as being performed by a data processor, such as a computing platform for executing a plurality of instructions.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

FIG. 11 is a flowchart of a method for magnetic resonance analysis of an object, according to the present invention;

FIG. 20 is a schematic illustration of a top view of a quadrature RF resonator, according to the present invention;

FIG. 21 is a schematic illustration of electrical currents induced onto the surfaces of the conductive elements of the quadrature RF resonator, according to the present invention;

FIG. 22 is a schematic illustration of the voltage configuration of the quadrature RF resonator, according to the present invention;

DESCRIPTION OF THE PREFERRED EMBODIMENTS

Figure 1:
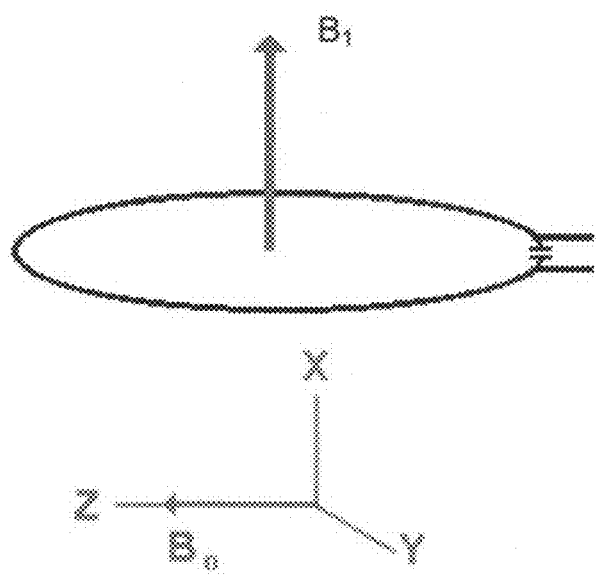
FIG. 1 is a schematic illustration of a prior art single-loop coil.
Figure 2:
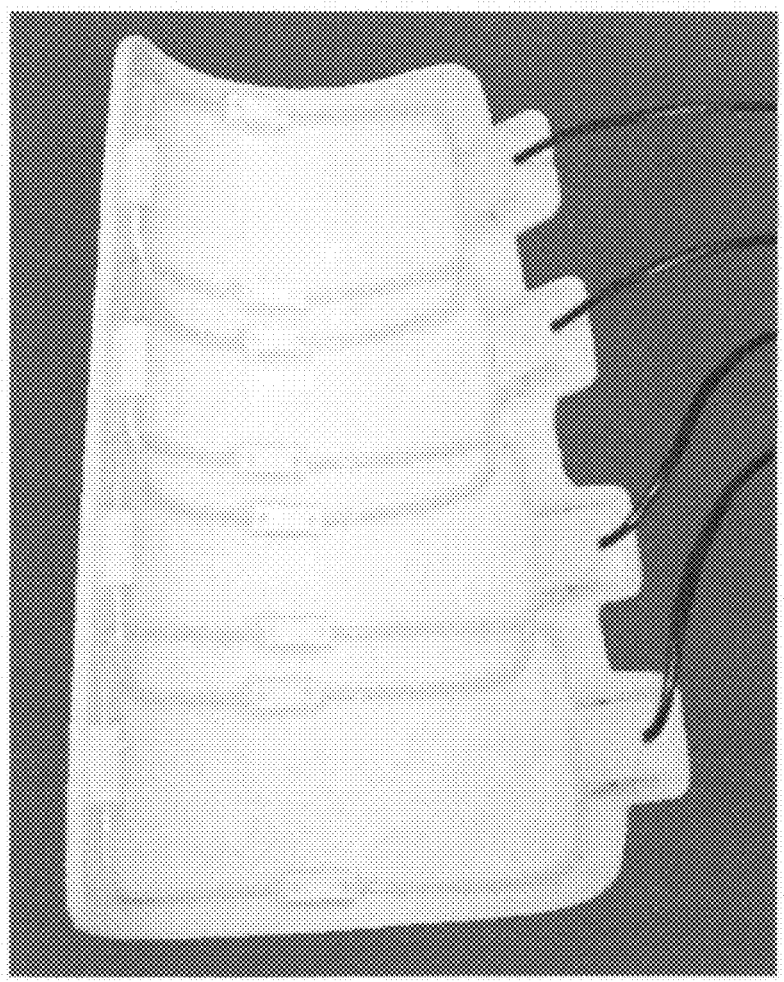
FIG. 2 is a schematic illustration of a prior art phased array coil.
Figure 3:
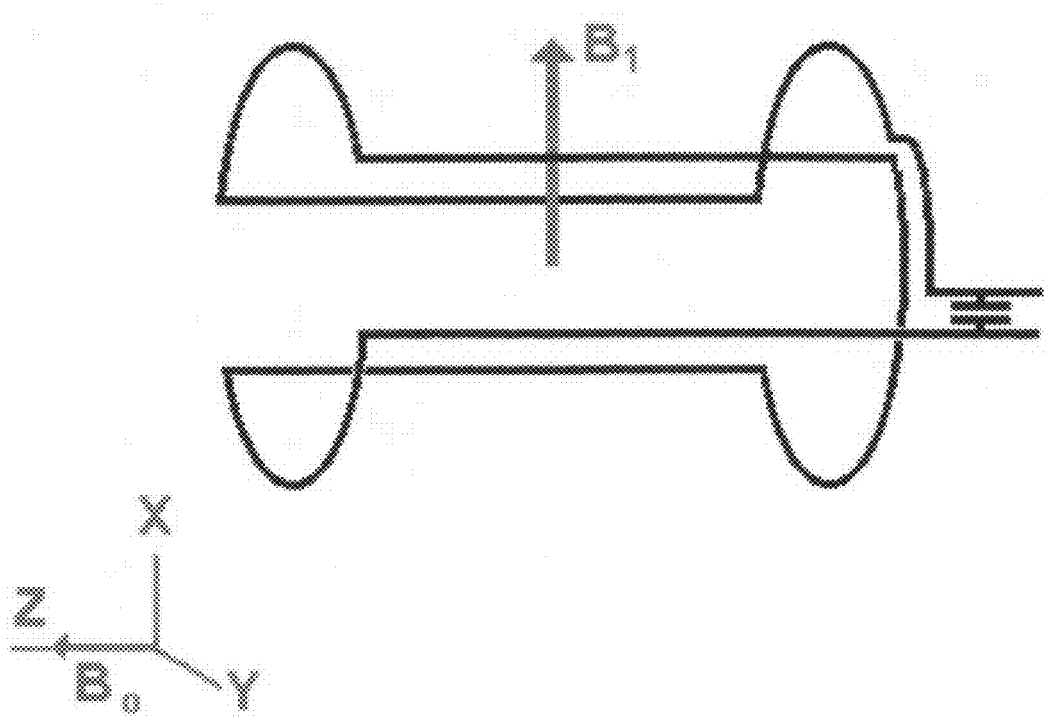
FIG. 3 is a schematic illustration of a prior art saddle coil.

The present invention is of an RF magnetic field resonator which can be used for magnetic resonance analysis, such as MRI. Specifically, the present invention is of a simple-designed RF resonator which can be used to provide a substantially homogeneous RF magnetic field in an MRI apparatus. The present invention is further of a method of designing the RF resonator, an MRI apparatus incorporating the RF resonator and a method of magnetic resonance analysis of an object using the RF resonator.

The principles and operation of an RF resonator according to the present invention may be better understood with reference to the drawings and accompanying descriptions.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

According to one aspect of the present invention there is provided an RF resonator for magnetic resonance analysis, generally referred to herein as RF resonator 10.

Figure 8A:
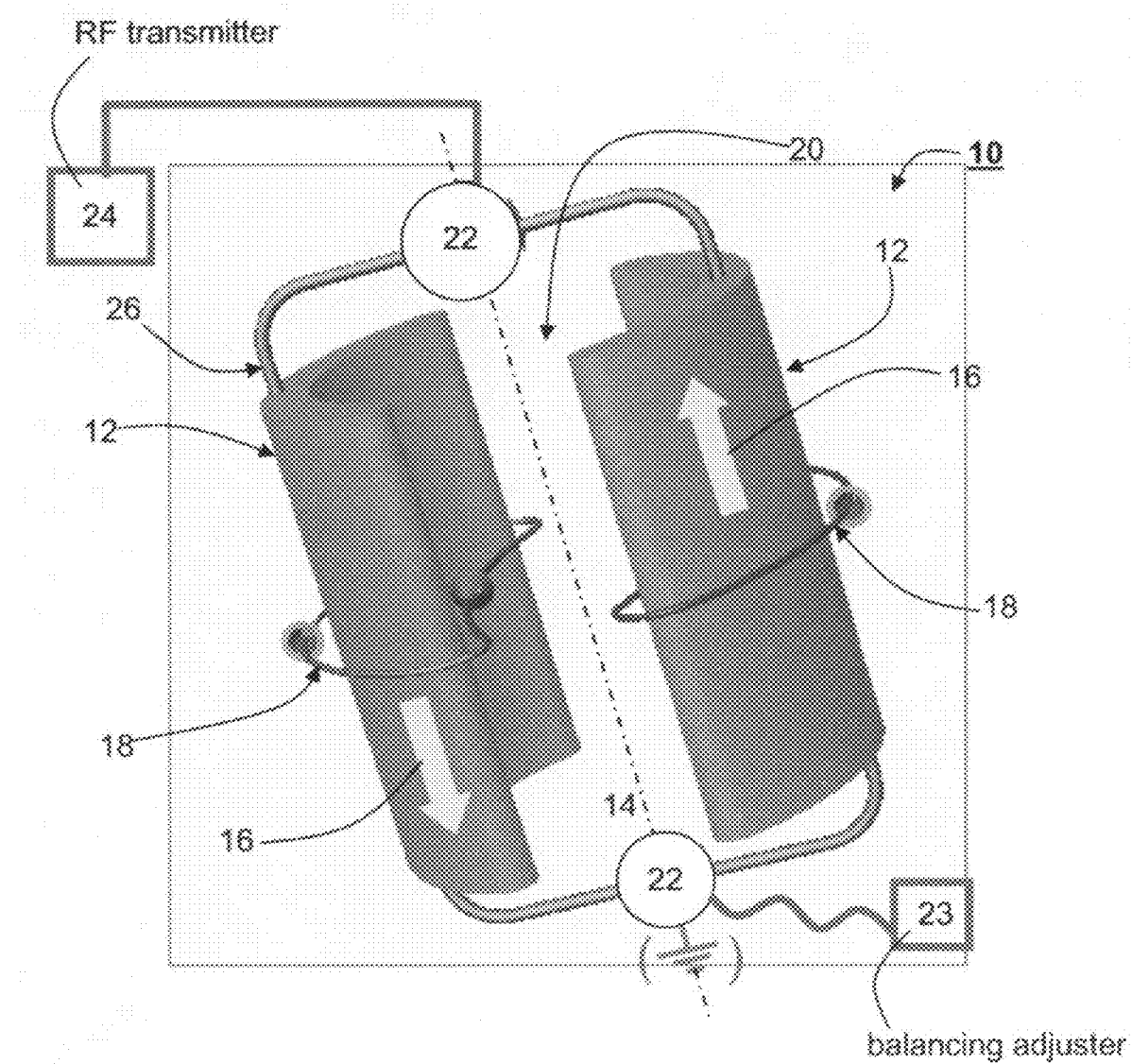
FIGS. 8a-c are schematic illustrations of a radiofrequency resonator for magnetic resonance analysis, according to the present invention.
Figure 8B:
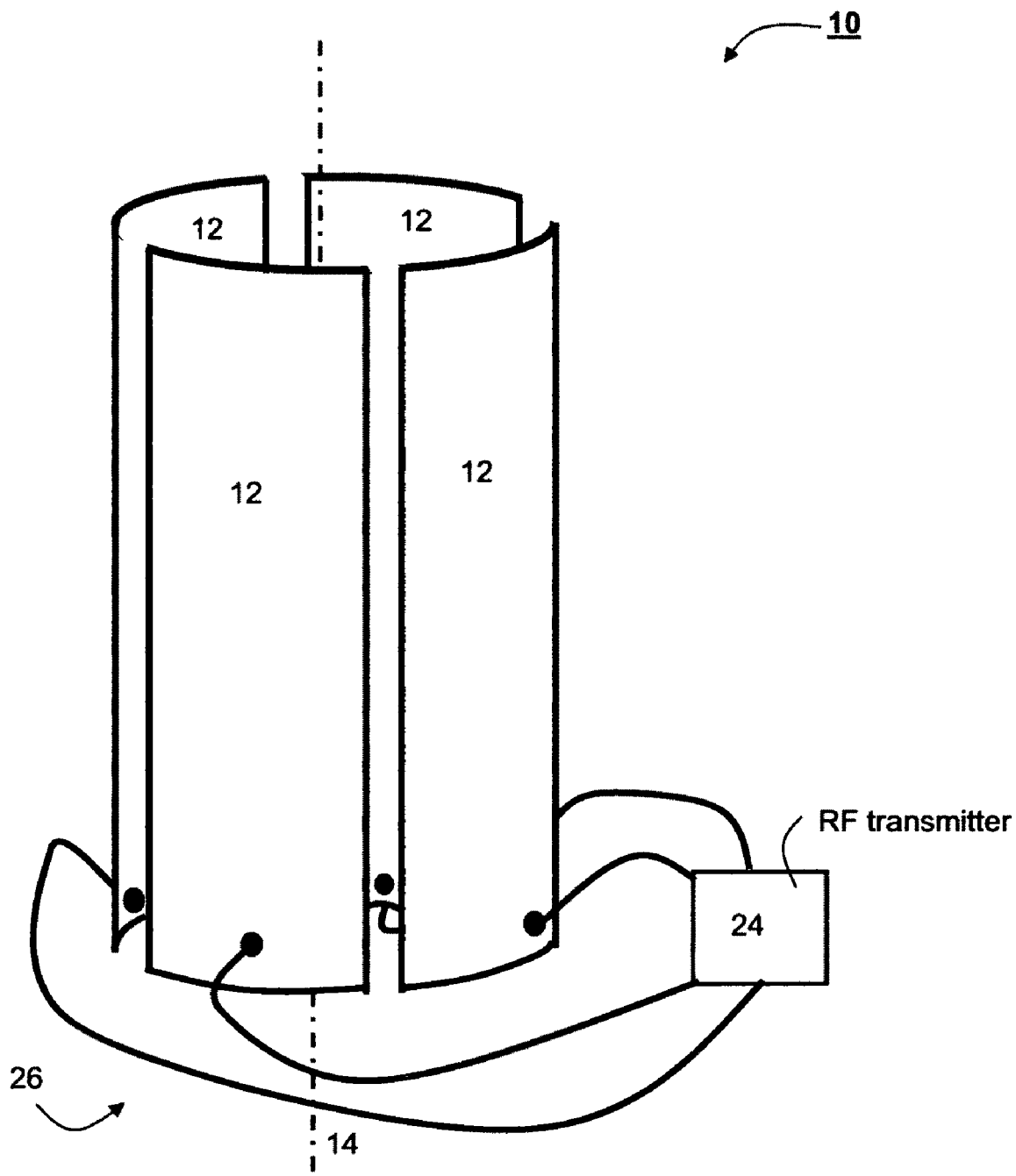
Figure 8C:
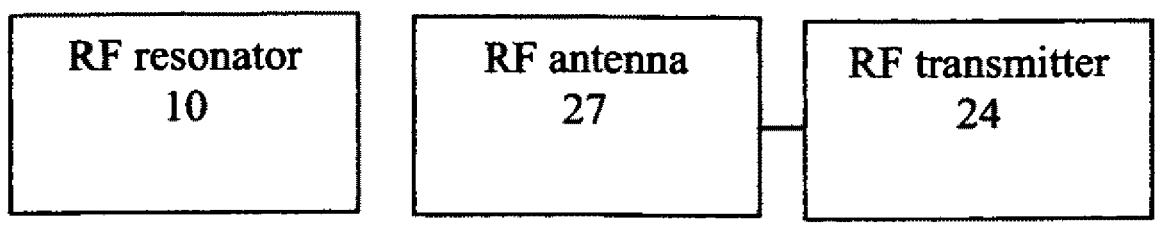

Referring now to the drawings, FIGS. 8a-c illustrate RF resonator 10, which comprises at least two conductive elements 12, spaced along a longitudinal axis 14, where each conductive element has a first curvature along a direction perpendicular to longitudinal axis 14. According to a preferred embodiment of the present invention any number (larger than two) of conductive elements may be used. Hence, an example of two conductive elements configuration is shown in FIG. 8a, and an example of four conductive elements configuration is shown in FIG. 8b. Anti-parallel RF currents 16, flowing within conductive elements 12 in a direction of longitudinal axis 14, generate an RF magnetic field 18 in a volume 20, defined between conductive elements 12.

Magnetic field 18 is directed perpendicular to longitudinal axis 14, and it is substantially homogenous. A preferred characterization of the homogeneity of magnetic field 18 is a magnetic field variation which is less than about 20% within about 80% of volume 20. More preferably, the homogeneity of magnetic field 18 is characterized by a magnetic field variation which is less than about 5% within about 50% of volume 20.

As used herein the term "about" refers to ±10%.

RF resonator 10 further comprises an electronic circuitry 22 which, as further detailed hereinunder, is primarily designed and configured for three purposes, which are considered as three degrees-of-freedom of RF resonator 10: (i) providing predetermined resonance characteristics of RF resonator 10; (ii) matching an impedance of RF resonator 10 to an impedance of an RF transmitter 24 electrically communicating with electronic circuitry; and (iii) balancing the RF magnetic field to have a substantially symmetrical profile with respect to a transverse axis (i.e., perpendicular to longitudinal axis 14), hence correcting sample effects on circuitry 22.

Before providing a further detailed description of RF resonator 10, as delineated hereinabove and in accordance with the present invention, attention will be given to the advantages and potential applications offered thereby.

Hence, the construction and the design of RF resonator 10 allows for optimizing the RF magnetic field generated therein so that the amount of RF field inhomogeneity is substantially minimize, even when RF resonator 10 is loaded with an object. More specifically, RF resonator 10 enjoys properties exceeding all prior art coils, such as surface coils, birdcage coils and slotted tube coils (for further description of these prior art coils, see the drawings and the accompanied description in the Background section hereinabove).

With respect to prior art surface coils, whereas the transverse field of such coils is very inhomogeneous except for a narrow surface, the magnetic field generated by RF resonator 10 is substantially homogenous throughout the volume defined between conductive elements 12, thus, the entire object of interest can be imaged to a large extent of quality.

With respect to prior art birdcage coils, although, theoretically, the large number of difference-phased current-loops in these coils (typically of the order of ten) allow for generating a homogenous RF field, birdcage coils are associated with an inherent limitation, in which the number of tunable capacitors which are needed to match and tune the birdcage coil is impractical. Hence, as stated, some capacitors are fixed to a predetermined value of capacity, leaving only a small portion of the available degrees-of-freedom to be corrected. In is recognized that, on the one hand, due to the large number of different phased current-loops (hence the a priori large number of degrees-of-freedom), birdcage coils are extremely complicated in terms of design and manufacturing process. It would be therefore appreciated, that the trade-off compromising in the number of degrees-of-freedom limits the capability to tune and match the birdcage coil to the quality for which it has been originally designed. As opposed to the birdcage coil, RF resonator 10 enjoys the advantage of having a small number of current-loops, hence, the procedures of matching and tuning RF resonator 10 is substantially simplified over the respective procedures in prior art birdcage coils.

With respect to the slotted tube coils, in contrast to the birdcage coils, where the theoretical number of degrees-of-freedom is impractical, the available number of degrees-of-freedom in the slotted tube coils is too small to allow high quality imaging. Specifically, whereas slotted tube coils are equipped with tuning and matching circuitries, these coils fail to provide solutions to the problems associated with effects of field-sample interactions. A particular feature of RF resonator 10, on the other hand, is the additional degree-of-freedom of balancing the RF field which is provided by electronic circuitry 22 in addition to the tuning and matching degrees-of-freedom. As demonstrated in the Examples section that follows, the ability to balance the RF field to a symmetrical profile substantially minimizes inhomogeneities due to field-sample interactions.

The homogeneity of the RF field is achieved by a judicious selection of both the electrical setup connected to conductive elements 12 (e.g., electronic circuitry 22), and the geometrical characteristics (e.g., profile shape, dimensions, etc.) of conductive elements 12. According to a preferred embodiment of the present invention the additional conductive elements may be added to RF resonator 10, so as to further improve the magnetic field homogeneity. The effect of the additional conductive elements on the homogeneity of the magnetic field is demonstrated below in FIG. 12*d* in the Examples section, where the additional conductive elements are designated 13. Preferably, a phase of the RF current flowing through additional conductive element 13 equals a phase of the RF current flowing through conductive elements 12.

The electrical setup and the geometrical characteristics depend on the number of conductive elements 12. Hence, in one embodiment in which four conductive elements are used (FIG. 8*b*), the electrical setup and the geometry are preferably such that one pair of conductive elements is electrically and magnetically decoupled from the other pair. The geometrical shape of conductive elements 12 is not limited. Thus, the first curvature can be, for example, a curvature of cylinder, a curvature of an ellipsoid, a curvature of a hyperboloid, a curvature of a paraboloid or a curvature of an irregular surface. According to a preferred embodiment of the present invention conductive elements 12 may also have a second curvature along longitudinal axis 14, which second curvature is also not limited and can be, for example, any of the above curvatures. Both the first and the second curvatures may be either constant or variable curvature. For example, the first curvature may vary with an azimuthal angle and the second curvature may vary with an inclination angle.

According to the basic laws of electromagnetism, any coil which is designed for generating a magnetic field induces some boundary effects near its edges which are manifested through inhomogeneities in the magnetic field. Therefore, the longitudinal dimension of conductive elements 12 is preferably selected so as to minimize such inhomogeneities to occur on the imaged object. Specifically, the edges of RF resonator 10 are preferably designed sufficiently far from the object to be imaged.

The separation between conductive elements 12 is preferably selected according the application, so that RF resonator 10 surrounds the object which is to be imaged. In one embodiment, the separation is such that conductive elements 12 effectively surround the imaged object.

RF resonator 10 may also be coupled to RF transmitter 24, via a transmission line 26. It is often desired to minimize energy losses between RF transmitter 24 and RF resonator 10. It is known that the transferred energy between two electronic elements is maximal if their impedances match. Thus, preferably, the impedance of RF resonator 10 is substantially the same as the internal resistance of RF transmitter 24. A typical value for the internal resistance of RF transmitter 24 is about 50Ω.

With reference to FIG. 8*c*, in another embodiment, the coupling between RF resonator 10 and RF transmitter 24 is via an RF antenna 27 (e.g., another coil) rather than via RF transmission line 26. In this embodiment, RF resonator 10 is wireless and all its energy is transferred from RF transmitter 24 via mutual inductance of RF antenna 27 and RF resonator 10.

A well known phenomenon in the art of MRI, already discussed in the Background section above, is that the imaged object, once loaded into the resonator, alters many of its characteristics (e.g., the impedance, the resonance frequencies and the RF field lines), as compared to the original characteristics obtained during the design of the resonator. Electronic circuitry 22 serves for tuning the resonance frequencies to their desired values, for matching the impedance of RF resonator 10 to the impedance of RF transmitter 24 and for balancing the RF magnetic field symmetry which is distorted by the imaged sample.

A detailed description of circuitry 22, according to preferred embodiments of the present invention, is provided herein, where the description of the tuning and matching precedes the description of the balancing.

Resonance tuning and impedance matching are well known in the art, and each independently may be done by more than one way, e.g., via tunable capacitors, tunable inductors. In addition, the tuning and/or the matching may be done by varying mutual inductance between inductors (for example, mutual inductance between RF resonator 10 and RF transmitter 24 or mutual inductance between elements in circuitry 22 and RF transmitter 24). Still in addition, the tuning and/or the matching may be done by constructing an arrangement of transmission lines having predetermined impedance.

Thus, according to a preferred embodiment of the present invention, circuitry 22 comprises an arrangement of capacitors, tunable capacitors, inductors, tunable inductors and/or transmission lines, which have typical impedance.

The capacitors used in circuitry 22 may be of any kind presently known in the art, e.g., regular capacitors, vacuum capacitors or other high power capacitors. Capacitors or tunable components which are expected to be developed during the life time of this patent are not excluded.

Attention is now made to the novel concept of balancing the RF magnetic field. The spatial shape of the electromagnetic radiation from conductive elements 12 within the volume-of-interest depends on the geometry of the volume-of-interest and on the RF currents flowing through conductive elements 12 (and through additional conductive elements 13, in the embodiments in which elements 13 are used). For a given geometry, however, the spatial shape of the electromagnetic radiation in a vacuum depends exclusively on the RF currents.

Hence, according to a preferred embodiment of the present invention, circuitry 22 is configured and designed to control the RF currents through conductive elements 12 so that the generated magnetic field inside the volume-of-interest has a substantially symmetric profile. For example, in a preferred embodiment in which there are two opposite conductive elements having identical geometry, a symmetrical profile may be ensured, by imposing a zero electric potential on a specific point of circuitry 22 so that anti parallel currents in the conducting elements are equal. Other potential configurations may also be used for providing a symmetrical magnetic RF field profile, within the volume-of-interest.

Thus, unlike, e.g., the birdcage coil, where, even when an ideal homogenous sample is used, no full compensation of the coil homogeneity is feasible once the tuning and matching capacitors are changed, electronic circuitry 22 has a particular feature of balancing the RF field to have a substantially symmetric profile thereby to considerably reduce sample effects. One ordinarily skilled in the art would appreciate that the balancing of the RF field may be achieved not only in cases of artificial sample but rather on real objects which are to be imaged. Moreover, for an object having a mirror symmetry (such as, but not limited to, a human head), it is always possible to obtain a symmetric profile for the RF field, provided that the symmetry axis of the objects is parallel to longitudinal axis 18.

The balancing of the RF field may be done either during the manufacturing of RF resonator 10 (the so called "factory settings"), or while RF resonator is in medical use. Specifically, RF resonator 10 preferably comprise a balancing adjuster 23 electrically communicating with circuitry 22 so that while in operational mode, balancing adjuster 23 tunes the tunable components of circuitry 22 until the RF field has a substantially symmetrical profile with respect to a transverse axis (i.e., perpendicular to longitudinal axis 14).

It is to be understood, however, that although RF resonator 10 has the advantage that the resonance tuning, the impedance matching and the RF field balancing are controlled by the same circuitry (e.g., circuitry 22), other circuitries may also be employed for performing any combination of the above adjustments.

As stated, RF resonator 10 may include any number (larger than two) of conductive elements 12. The selected number affects the characteristic of the produced magnetic field, in particular its homogenous area and its polarization. Thus, according to a preferred embodiment of the present invention additional conductive elements are used to further improve the magnetic field homogeneity. In this embodiment, the currents flowing in the additional elements are related to currents 16 by a predetermined functional relation. Predetermined functions which may be used for this purpose include, but are not limited to, a linear function, a polynomial function, an exponential function, a rational function, a power function or any combination thereof. For example, the currents flowing in the additional elements may be a predetermined fraction (e.g., one half) of currents 16.

For the purpose of magnetic resonance imaging, as well as for magnetic resonance analysis may be performed, many field polarization may be used, provided that the respective polarization may be mathematically expanded, such that at least one component of the expansion ensures a magnetic field which rotates about the direction of the main static magnetic field. For example, the polarization may be circular or linear, where the linear polarization is viewed as an equal weight sum of a left-hand circular polarization and a right-hand circular polarization. An RF resonator which generates a linearly polarized RF field is called a linear resonator, and an RF resonator which generates a circularly polarized RF field is called a quadrature resonator [C.-N. Chen et al., "Quadrature Detection Coils—A Further Improvement in Sensitivity", *J. Magn. Reson.*, 54:324-327, 1983].

The present invention successfully addresses the issue of polarization of the magnetic field. Thus, according to a preferred embodiment of the present invention the number of conductive elements 12 is selected so that the RF field is linearly polarized. Hence in this embodiment RF resonator 10 is a linear resonator. The linearly polarized field is preferably produced by two conductive elements, e.g., as shown in FIG. 8a.

According to another preferred embodiment of the present invention the number of conductive elements 12 is selected so that the RF field is substantially circularly polarized. Hence in this embodiment RF resonator 10 is a quadrature resonator. The circularly polarized field is preferably generated by four conductive elements, e.g., as shown in FIG. 8b. In this embodiment, the four conductive elements are preferably arranged so that perpendicularity is maintained, as further detailed hereinunder.

The conductive elements may be of any known conductive material such as, but not limited to, gold, silver, copper, copper sheets. In one embodiment conductive elements 12 are made of a superconducting material. In this embodiment RF resonator 10 further comprises means for preserving conductive elements 12 at a sufficiently low temperature to maintain the superconductivity. Such temperatures may range between about 4.7 K and about 10 K and technologies allowing superconductivity in this contexts are described in R. S. Withers, et al., "Thin-Film HTS Probe Coils for Magnetic Resonance Imaging" *SPLE Proc.*, Series 2156, High-T: Microwave Superconductors and Applications, 2427 January 1994, Los Angeles, Calif., 27-35, and R. D. Black, et al., "A High Temperature Superconducting Receiver for Nuclear Magnetic Resonance Microscopy", Science 259: 793-95, 1993. However it is to be understood that other technologies, e.g., of high temperature superconductivity, which will be developed during the lifetime of this patent are not excluded.

As further detailed hereinbelow, RF resonator 10 may be used, for example, in an MRI apparatus which includes, inter alia, one or more gradient coils used. Typically, once gradient coils are switched on, a rapidly growing electromagnetic field is generated, resulting in inductance of eddy currents in other surrounding conductors. According to the laws of electromagnetism, these eddy currents generate electromagnetic fields opposing the original field. Hence, according to a preferred embodiment of the present invention, conductive elements 12 are designed and constructed to minimize eddy currents generated therein, thereby to allow the DC field generated by the gradient coils to penetrate through conductive elements 12 once the gradient coils are switched on. This may be done, for example, by constructing conductive elements 12 such that each conductive elements is characterized by the so called "RF shield structure". In other words, conductive elements 12 also serve as a low-pass filter transparent to a DC field, while being opaque to the RF field.

More specifically, conductive elements 12 may be manufactured as two conductive foils (e.g., copper foils, or superconducting foil) having a dielectric material therebetween, thereby forming a double sided conductive surface. The formation of eddy currents may then be prevented by etching narrow gaps on each side of the double sided conductive surface such that no two gaps overlap. Thus, when the narrow gaps are filled with a dielectric material having the appropriate properties (e.g., dielectric constant and thickness), the gaps, while being transparent to the DC gradient field, are still opaque to the RF currents. It is to be understood, however, that unlike the birdcage coil, where currents flowing through the legs of the birdcage coil are with different phases, the RF currents flowing in each one of conductive elements 12 are all in one phase.

The present invention successfully provides a method of designing an RF resonator for magnetic resonance analysis, for example RF resonator 10. The method comprises the following method steps which are illustrated in the flowchart of FIG. 9.

Figure 9:
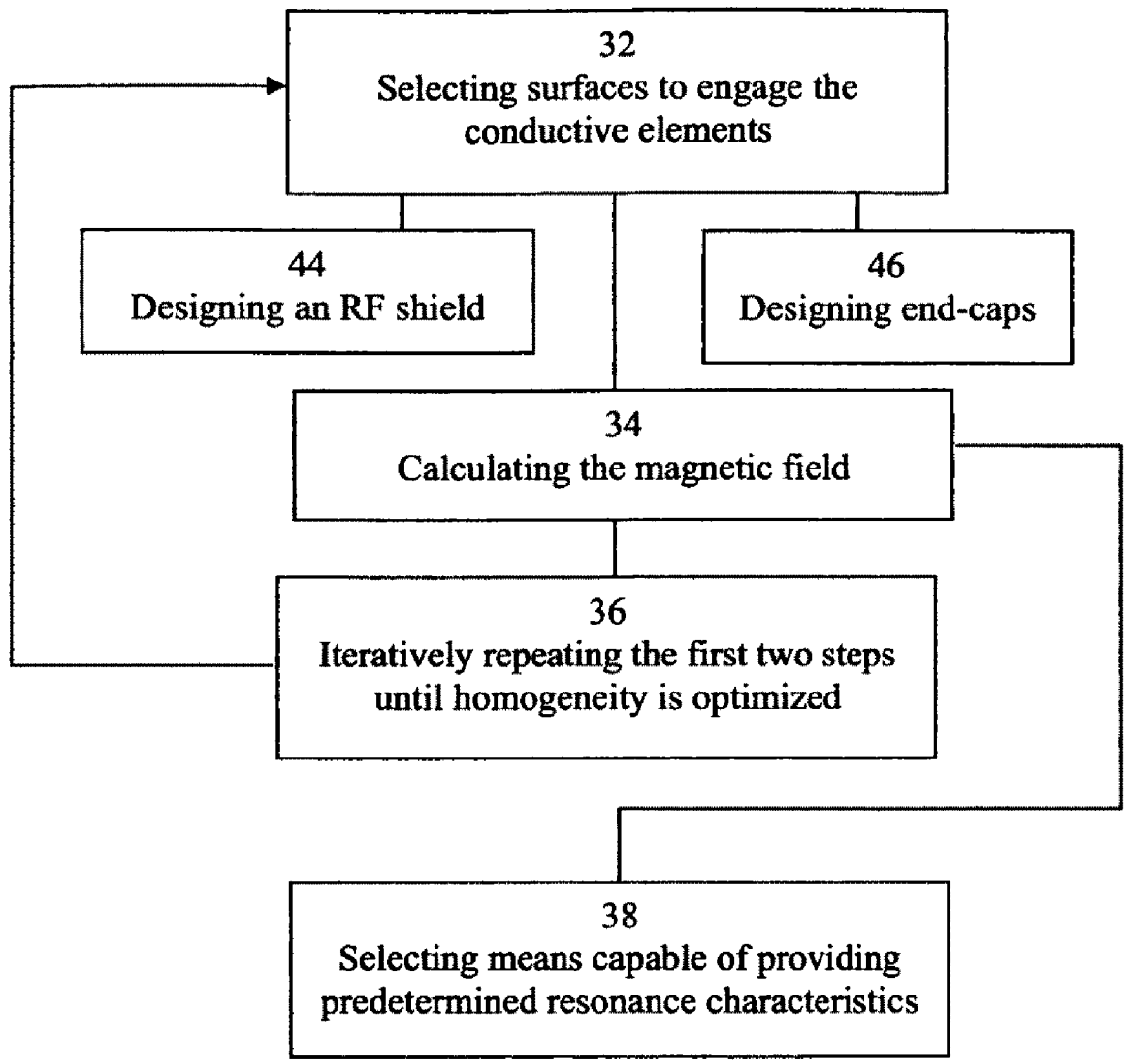
FIG. 9 is a flowchart of a method of designing a radiofrequency resonator for magnetic resonance analysis, according to the present invention.

Hence, in a first step, designated in FIG. 9 by Block 32, at least two computationally defined surfaces are selected for engaging at least two conductive elements (e.g., conductive elements 12). The surfaces have a first curvature along a direction perpendicular to a longitudinal axis, and may have a second curvature along the longitudinal axis. The number of surfaces (and therefore also the number of conductive elements) is preferably selected according to the desired polarization of the RF field, as further detailed hereinabove and exemplified in the Examples section that follows. The number of surfaces also dictates the number of eigenvectors (current-modes) which appear in the solution of the corresponding eigenvalue equation for the currents flowing through the conductive elements. Specifically, the number of surfaces equals the number of eigenvectors, thereby to the number of eigenvalues, which, as already explained in the Background section hereinabove, are related to the resonance frequencies of the RF resonator.

Unlike birdcage coil, where the number of legs (therefore also the number of undesired resonance frequencies which are to be eliminated) is large, in the RF resonator of the present invention, the number of conductive element is preferably selected so as to minimize the overall number of current-modes. Thus, for small number of conductive elements, there are a small number of current-modes corresponding to a small number of resonance frequencies. Being sufficiently spaced apart in the frequency space, the desired mode may be easily selected, leaving the undesired modes to be substantially inactive.

In a second step of the method, designated by Block 34, a magnetic field is calculated within the surfaces. Unlike the design of prior art coils (e.g., birdcage coils), the design of the magnetic field is completely decoupled from the design of the resonance characteristics of the resonator. Thus, in a third step, designated by Block 36 in FIG. 9, the first and the second steps are iteratively repeated so as to provide optimize geometry which corresponds to a substantially homogenous magnetic field. Specifically, in each iterative step, any specific combination of curvature, length, separation and number of conductive elements may be tested to optimize the homogeneity of the magnetic field.

In a fourth step, designated by Block 38, means capable of providing predetermined resonance characteristics of the RF resonator, are selected based on the optimize geometry and the magnetic field which are already known from the third step. Preferably, frequency shifts which may occur due to the future existence of an imaged object within the RF coils are considered while the fourth step is executed. Still preferably, impedance differences which may be present between the RF resonator and the RF transmitter are considered in the forth step. Thus, the means which are selected preferably comprise an arrangement of tunable components which can be used for impedance matching. Further preferably, the profile of the RF field with respect to a transverse axis is considered in the fourth step. In other words, the means which are selected preferably designed to facilitate the above-mentioned process of balancing the RF field lines, so as to have a substantially symmetrical profile with respect to a transverse axis It is to be understood that the execution of the fourth step is far simpler than an equivalent step in the design of, e.g., a birdcage coil, due to the relatively small number of current-modes. Specifically, as further demonstrated in the Examples section that follows, it is sufficient to select a small number of tunable components in the design of the RF resonator, so that once the RF resonator is reduced to practice, these tunable components are used for tuning, matching and balancing the RF resonator. Although, the tuning, matching and balancing are, in principle, repeated iteratively, one would appreciate that as the number of tunable components is minimized the simplicity of finding an optimal solution is maximized.

The second step of the method may be executed in more than one way. In one embodiment, the second step is executed straightforwardly by solving the set of Maxwell's equations within the geometry selected in the first step, thereby to obtaining electromagnetic field lines.

In another embodiment, the second step is executed by a method known as the finite element method. The finite element method is described, for example, in a book by Jianming Jin, entitled "Electromagnetic Analysis and Design in Magnetic Resonance Imaging", published by CRC press LLC, the contents of which are hereby incorporated by reference. This embodiment is preferably used in cases in which the size of the RF resonator is smaller than the desired resonant wavelength. The basic principle of this method is to divide the space into a plurality of finite elements (e.g., rectangular elements, triangular elements and the like) and to use these elements for solving the governing equations.

In an additional embodiment, the second step is executed by a method known as the moments analysis method, which is also described, e.g., in the book of Jianming Jin (ibid). This embodiment is preferably used when the size of the RF resonator is comparable to the desired resonant wavelength. The basic principle of the moments analysis method is to formulate and solve an integral equation representing the fields, produced by currents flowing in the RF resonator, using a free-space Green's function.

The RF resonator, designed according to the above method steps, may be used, e.g., in an MRI apparatus combining the RF resonator, a device for providing a static magnetic field and maybe also one or more gradient coils. It is known that when the RF field electromagnetically interacts with the static magnetic field device and/or with the gradient coil(s) energy losses may occur, degrading the performances of the RF resonator. In addition, such electromagnetic interaction may shift the resonance frequency or even add more current-modes which are characterized by resonance frequencies which are close to the desired mode frequency, hence reduces the ability of the RF resonator to operate in a single, desired, resonance frequency.

Thus, according to a preferred embodiment of the present invention, the method further comprises a step of designing an RF shield for minimizing electromagnetic interactions between the RF resonator and the static magnetic field device and/or between the RF resonator and the gradient coil(s). This step is preferably executed prior to the second step and it is represented by Block 44 in FIG. 9. RF shields are known in the art and their design is straightforward once the RF resonator configuration is known. One method of designing an RF shield is known as the method of images, and is found, e.g., in an article by Jin J. M. et al., entitled "A Simple Method to Incorporate the Effects of an RF Shield into RF Resonator Analysis for MRI Applications", published in *IEEE Trans. Biomed. Eng.*, 42:840-843, the contents of which are hereby incorporated by reference. Other methods are found in Ong K C, et al., "Radiofrequency shielding of surface coils at 4.0 T" *Magn. Reson. Imag.* 5:233-237, 1987; and in Alecci M, "Characterization and reduction of gradient-induced eddy currents in the RF shield of a TEM resonator", *Magn Res in Medicine* 48:404-407, 2002.

In the method of images one assumes that the field produced by currents induced on the RF shield is a mirror image of the field produced by the original currents. Thus, given the original currents, one calculates the total RF field produced both by the original and by the induced currents.

According to a preferred embodiment of the present invention the method further comprises a step of designing at least one end-cap to be positioned adjacent to at least one end of the RF resonator for minimizing magnetic field inhomogeneities along the longitudinal axis. This step is preferably executed prior to the second step and it is designated by Block 46 in FIG. 9. End-caps are known in the art of magnetic resonance design and are used as "electromagnetic mirrors" which effectively increase the longitudinal dimension of the resonator. Thus, the end-cap minimizes boundary effects, hence reduces the field inhomogeneity, in particular near the edge where the end-cap is positioned.

According to an additional aspect of the present invention, there is provided an RF resonator for magnetic resonance analysis generally referred to herein as RF resonator 100. Hence, RF resonator 100 comprises at least two conductive elements 12, and at least one additional conductive element 13. The principles and operations of RF resonator 10 are similar to the principles and operations of RF resonator 10, as further detailed hereinabove. Conductive elements 12 and additional conductive elements 13 of RF resonator 100 are best illustrated in FIG. 12d of the Examples section hereinbelow.

Figure 10:
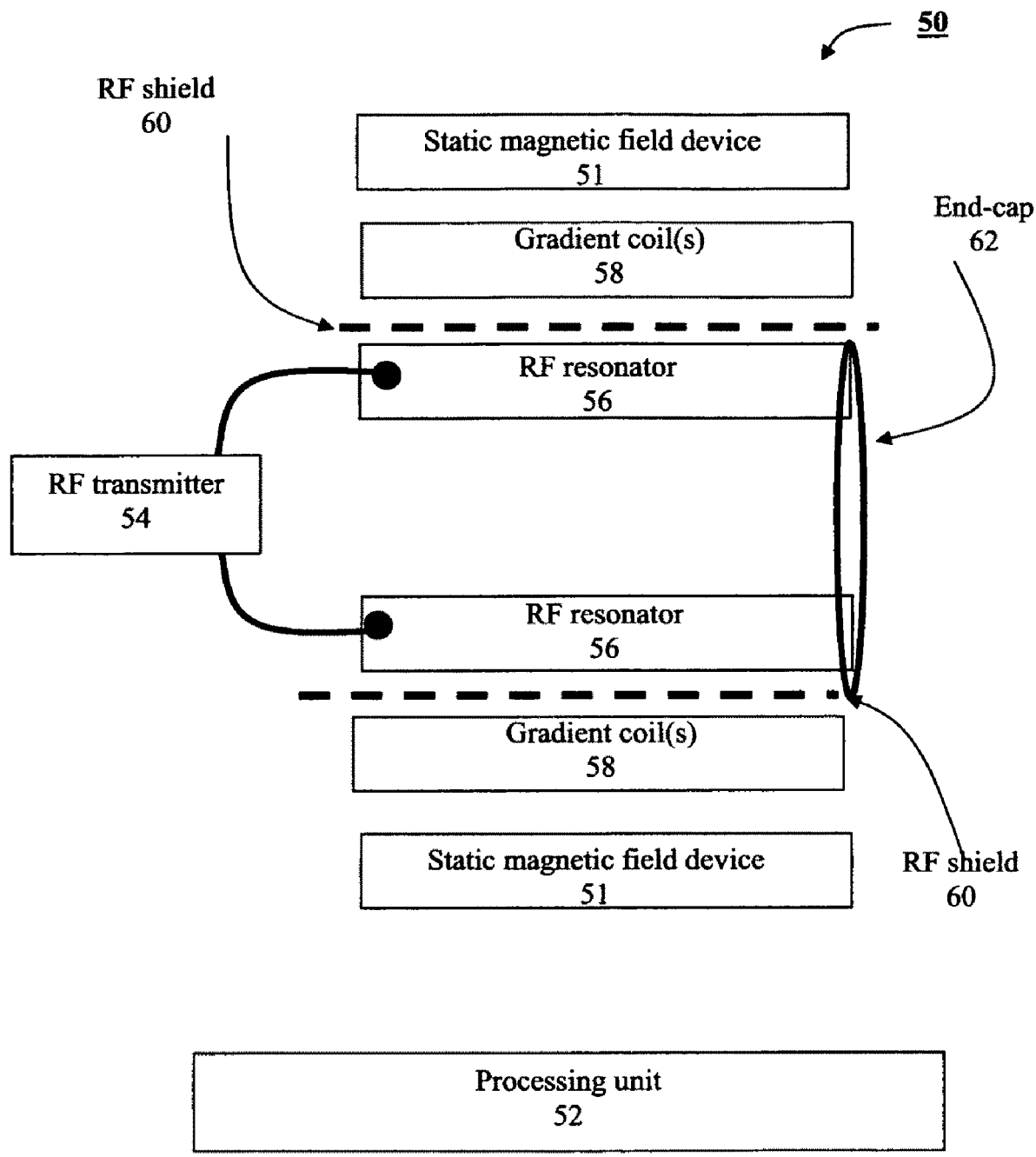
FIG. 10 is a block diagram illustrating an MRI apparatus, according to the present invention.

Reference is now made to FIG. 10, which is a block diagram illustrating an MRI apparatus, generally referred to as apparatus 50, according to an additional aspect of the present invention.

Hence, apparatus 50 comprises a device 51 for providing a static magnetic field. Device 51 may be, for example, a permanent magnet, an electromagnet, a superconductivity-based device and the like. It is expected that during the life of this patent many relevant magnets and electromagnets will be developed and the scope of the phrase "device for providing a static magnetic field" is intended to embrace all such new technologies a priori. For example, device 51 may comprises at least one shim coil for further corrections of the homogeneity of the static field.

Apparatus 50 further comprises a processing unit 52, an RF transmitter 54 and an RF resonator 56. The construction and operation of RF resonator 56 are similar to the construction and operation of RF resonator 10 or RF resonator 100 as further detailed hereinabove. RF resonator 56 may also have supplementary features with respect to RF resonator 10, for example, RF resonator 56 may be a multi frequency RF resonator designed for obtaining signals from two or more nuclei, each having a different gyromagnetic ratio (e.g., 1H and 31P). Additionally, RF resonator 56 may include conductive elements having a predetermined capacitance distribution, that reduce the electric field created by RF resonator 56, for minimizing effects of the imaged object on the magnetic field and for minimizing corona discharge from conductive elements 12.

According to a preferred embodiment of the present invention apparatus 50 may further comprise any number of gradient coils 58 for providing a predetermined gradient of static magnetic field. Any gradient coil known in the art of MRI may be used. As stated, electromagnetic interactions between the RF field and device 51 and/or between the RF field and the gradient coil(s) 58 result in undesired energy losses. Thus, apparatus 50 further comprises an RF shield 60, configured and designed for minimizing those electromagnetic interactions, as further detailed hereinabove. Apparatus 50 may also comprise one or more end-caps 62, positioned adjacent to one or more ends of RF resonator 56 for minimizing magnetic field inhomogeneities.

According to a preferred embodiment of the present invention apparatus 50 further comprises decoupling means for electrically decoupling RF resonator 54 from one ore more of gradient coils 58. This may be done, for example, by an enveloping external device having high value capacitors located thereon. Such a device is known as a DC block capacitors.

According to a preferred embodiment of the present invention apparatus 50 may include more than one RF resonator 56. For example, RF resonator 56 and one or more additional resonators may be arranged to form an RF resonator array, such as, but not limited to, a phased array. Preferably, all the RF resonators are electromagnetically decoupled from each other to avoid the undesired effect of interactions between the generated RF fields.

Reference is now made to FIG. 11, which is a flowchart of a method for magnetic resonance analysis of an object. The method comprises the following method steps in which in a first step, represented by Block 72, a static magnetic field is applied on the subject in a direction of a longitudinal axis. In a second step, represented by Block 74, substantially homogenous RF magnetic field is applied on the subject, using, e.g., RF resonator 10, 100 or 56, in a direction perpendicular to the longitudinal axis. In a third step, represented by Block 76, nuclear magnetic resonance parameters are acquired from the object, so as to analyze the object.

The MRI apparatus, the method of magnetic resonance analysis and any apparatus, device and/or system which employs the RF resonator described above may be employed on many objects which are to be imaged and/or analyzed. These include, but are not limited to, an animal (e.g., a human being), an organ of an animal, a tissue, a swollen elastomer and a food material. In addition, the object may be at least one type of molecules present (e.g., dissolved, dispersed or emulsed) in the solvent.

Additional objects, advantages, and novel features of the present invention will become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

EXAMPLES

Reference is now made to the following examples, which, together with the above descriptions, illustrate the invention in a non limiting fashion.

Example 1

A Linear RF Resonator

A prototype of a linear resonator having two conductive elements was designed and built for imaging a rat head in an 8.46 T static magnetic field generated by a AVANCE 360 WB spectrometer, purchased from Bruker Medizintechnik GmbH, D-76275 Ettlingen, Germany.

Description of the Prototype

The ratio between the resonator size and the resonance wavelength was selected to be about 0.02, hence, any variation of the RF phase was negligibly small (the so called "near-field approximation"). The mathematical reason for the smallness of variation is that the variation is proportional to the sine of the distance from the conductive element, hence, for distances which are sufficiently smaller than the wavelength, the sine (and the variation) approaches zero. Specifically, the distance from the conductive surfaces to the center of the imaged sample was 1.5 cm and the resonant wavelength was 83.2 cm. For such configuration the change in the wave amplitude over the sample is less than one percent. A non conductive gap of 2.5 mm between the conductive elements and the volume-of-interest was designed. The dimensions of the gap were selected for avoiding strong field effects near the conductive elements on the one hand, and for maintaining a sufficiently effective the pulse length on the other hand. The RF resonator was designed so as to be enveloped by a cylindrical shell of a gradient unit, 53 mm in diameter.

RF Field Simulation

The Laplace equation governing the static electric component of the field inside the RF resonator volume was solved by a finite difference method, utilizing SimIon 6.0 software.

For simplicity, infinitely long legs were assumed, thereby neglecting boundary effects the RF resonator has antiparallel mirror symmetry. Thus, in accordance with the uniqueness theorem of the Laplace equation, one half of the RF resonator was simulated and the other half was mirrored by a straight plane of zero field intensity.

The cylindrical container of the RF resonator served as an effective RF shield, hence simulated by a zero-potential half-circle.

Figure 12B:
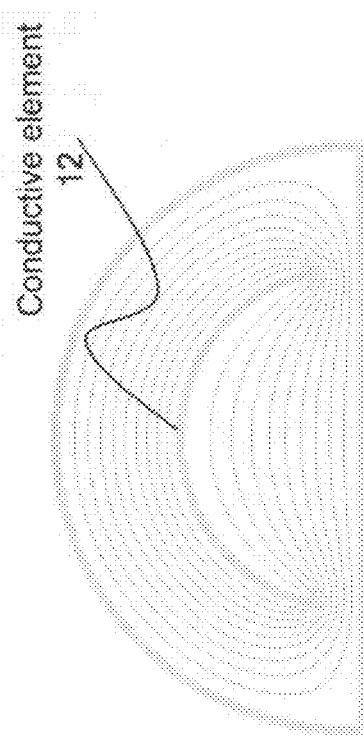
FIGS. 12a-f show the calculated equipotential lines of the field, for various profiles of the conductive elements of a prototype linear RF resonator, according to the present invention.
Figure 12D:
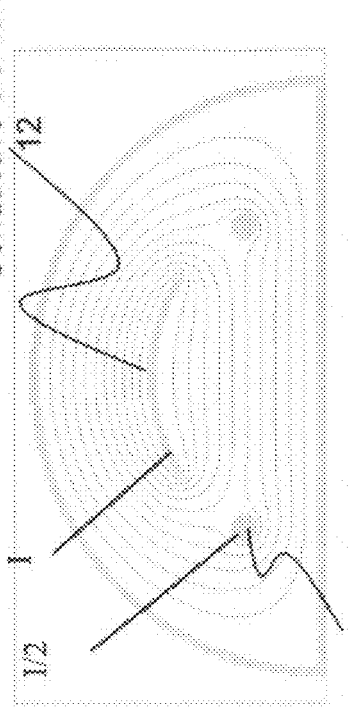
Figure 12A:
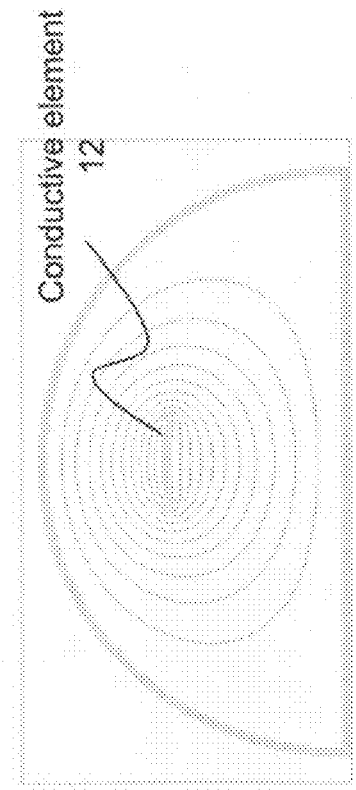
Figure 12C:
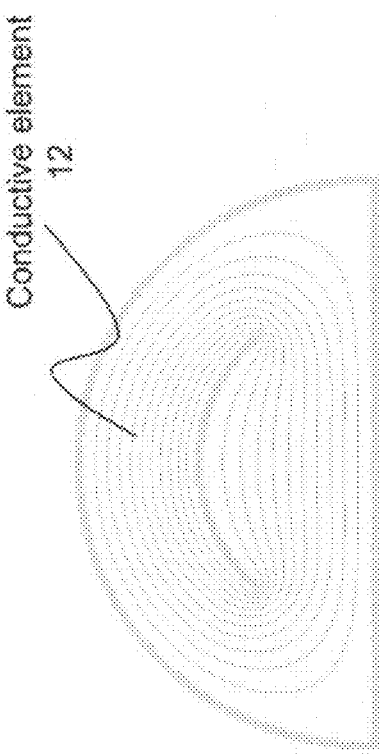

Reference is now made to FIGS. 12a-c, illustrating the calculated equipotential lines of the field, for various profiles of conductive elements 12. One ordinarily skilled in the art would appreciate that the equipotential lines also represent the pattern of the magnetic field for this simulation. FIGS. 12a and 12b show profiles which generate in homogenous field. FIG. 12c shows an optimal profile generating a central area of equally spaced and substantially parallel equipotential lines corresponding to a homogenous field. In this configuration a planar angle of 100° was measured from the center of the RF resonator to the edges of each conductive element.

Figure 12E:
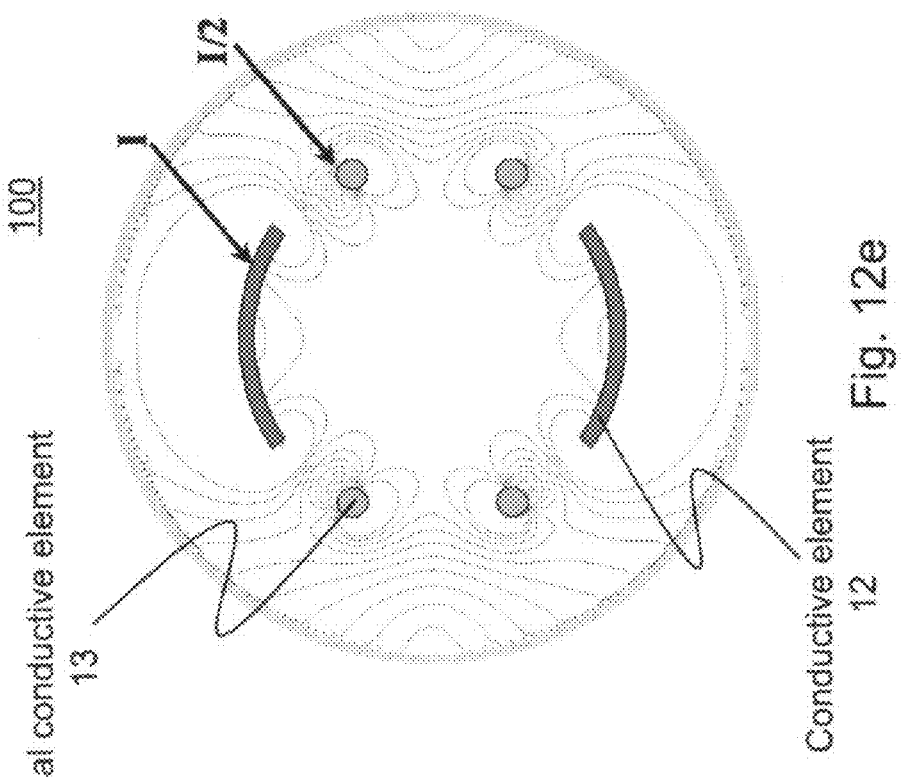

FIGS. 12d-e show simulations results in which additional conductive elements 13, carrying a current which is one half of the current flowing in conductive elements 12, are used in addition to conductive elements 12. FIG. 12d shows equipotential lines and FIG. 12e shows field lines where each field line represents an intensity step of 9%. It can be seen that additional conductive elements 13 serve for controlling the field homogeneity.

Figure 12F:
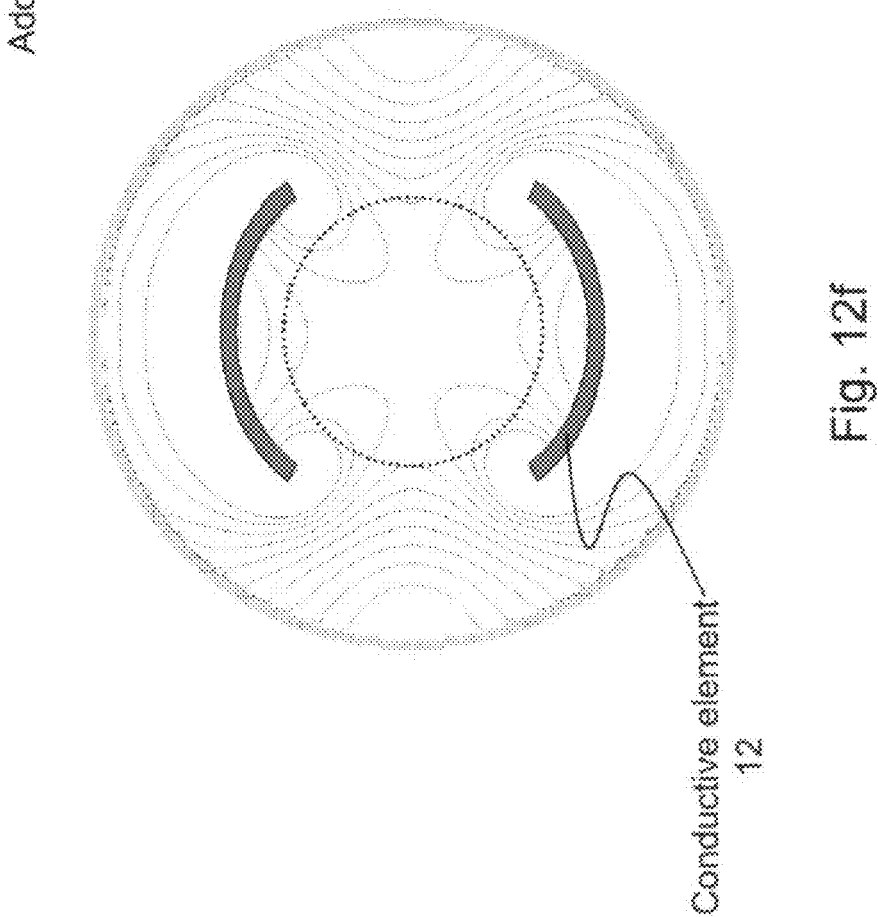

FIG. 12f shows results of electric field simulations of the prototype resonator. The simulations were executed using Matlab™ 6 software package, using a 120×120=14400 elements matrix. FIG. 12e is a contour plot of the electric field gradient, which represents the RF magnetic field.

A circular area-of-interest located in the central area of the prototype resonator was defined, which area-of-interest included 1130 out of the 14400 elements, and is equivalent to a circle 22 mm in diameter. The simulations were directed at calculating statistical characteristics of the area-of-interest. As the simulations are inherently symmetrical, it is sufficient to simulate one half of the transverse plane. As further demonstrated hereinafter, the same area-of-interest was defined for experimental measurements, where the resolution is about 44% higher (128×256 pixels).

The uniformity of the RF magnetic field was defined as:

$$\text{Uniformity} = 1 - \frac{\sigma}{\bar{I}}, \quad \text{(EQ. 1)}$$

where $\sigma$ is the intensity standard-deviation and $\bar{I}$ is the average intensity in the analyzed area. The uniformity was found to be 96% for the above described area of interest.

AC Simulations

The resonance characteristics were designed using the lumped elements method, employing Micro-Cap 6 software for the AC analysis. Possible deviation between the simulation process and the physical RF resonator were considered a-priori by introducing three tunable capacitors into the circuit.

Figure 13:
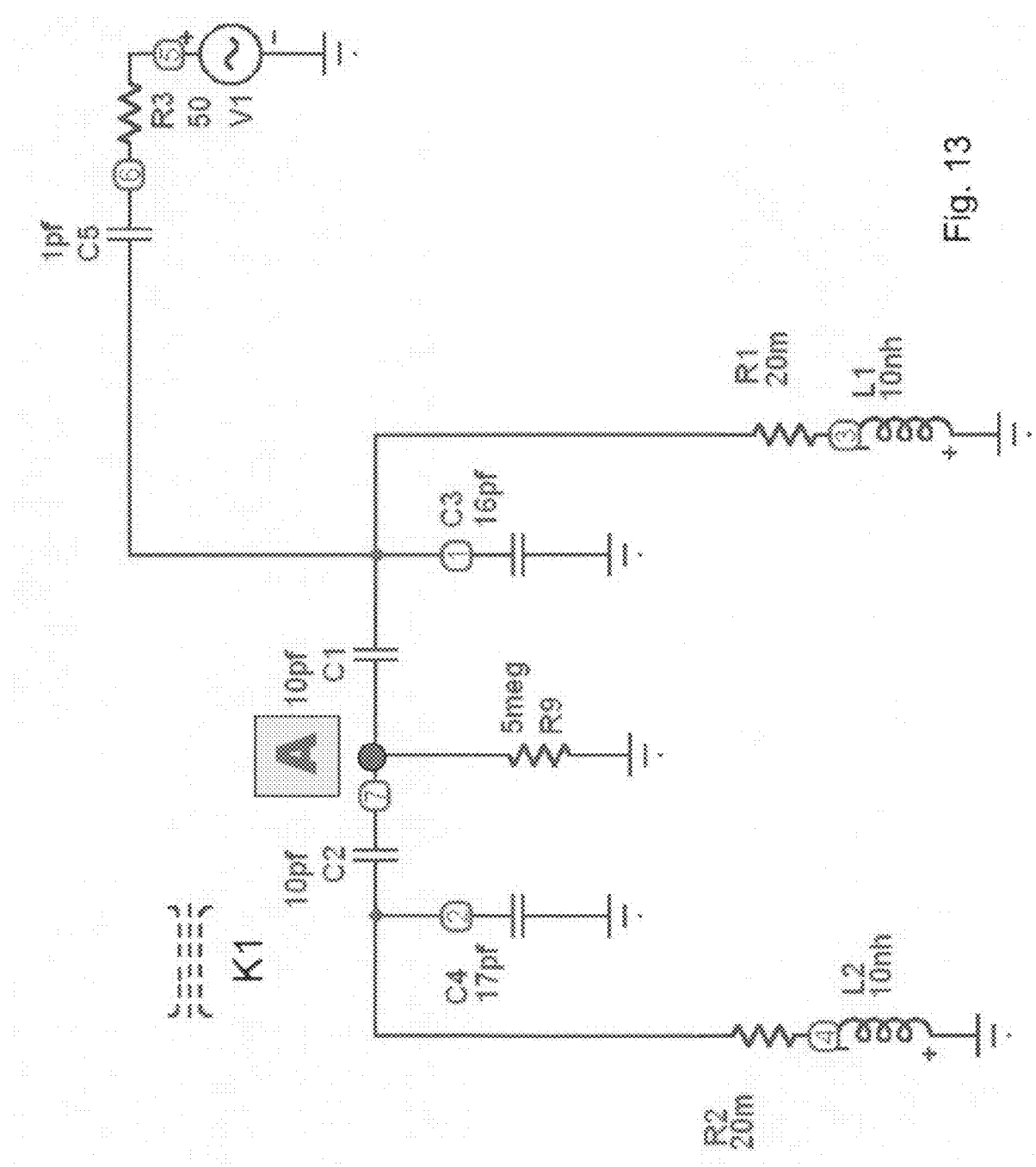
FIG. 13 is a schematic illustration of a circuit for AC simulations, according to the present invention.

FIG. 13 illustrates the simulated circuit. L1 and L2 are inductors representing conductive elements 12. C1, . . . , C5 are capacitors, R1, R2, R3 and R9 are parasite resistances V1 is an RF transmitter and K1 is the mutual inductance between L1, L2 and was set to be 0.3. The main current loop defined by elements L1, C1, C2 and L2 envelopes the sample to be imaged. Capacitors C3 and C4 were used for balancing between the left portion and the right portion of the circuit, while capacitor C5 was used for matching the circuit to RF transmitter V1. In the simulation, the current flowing through capacitors C3 and C4 was inductively decoupled from the main current-loop. In other words, the magnetic field that is generated by the current through capacitors C3 and C4 was not interacting with the sample. Resistor R9 was introduced for representing the sample's resistance. The simulations results are provided hereinbelow with reference to points-of-interest, designated in FIG. 13 by 1, 2 and 6.

Figure 14:
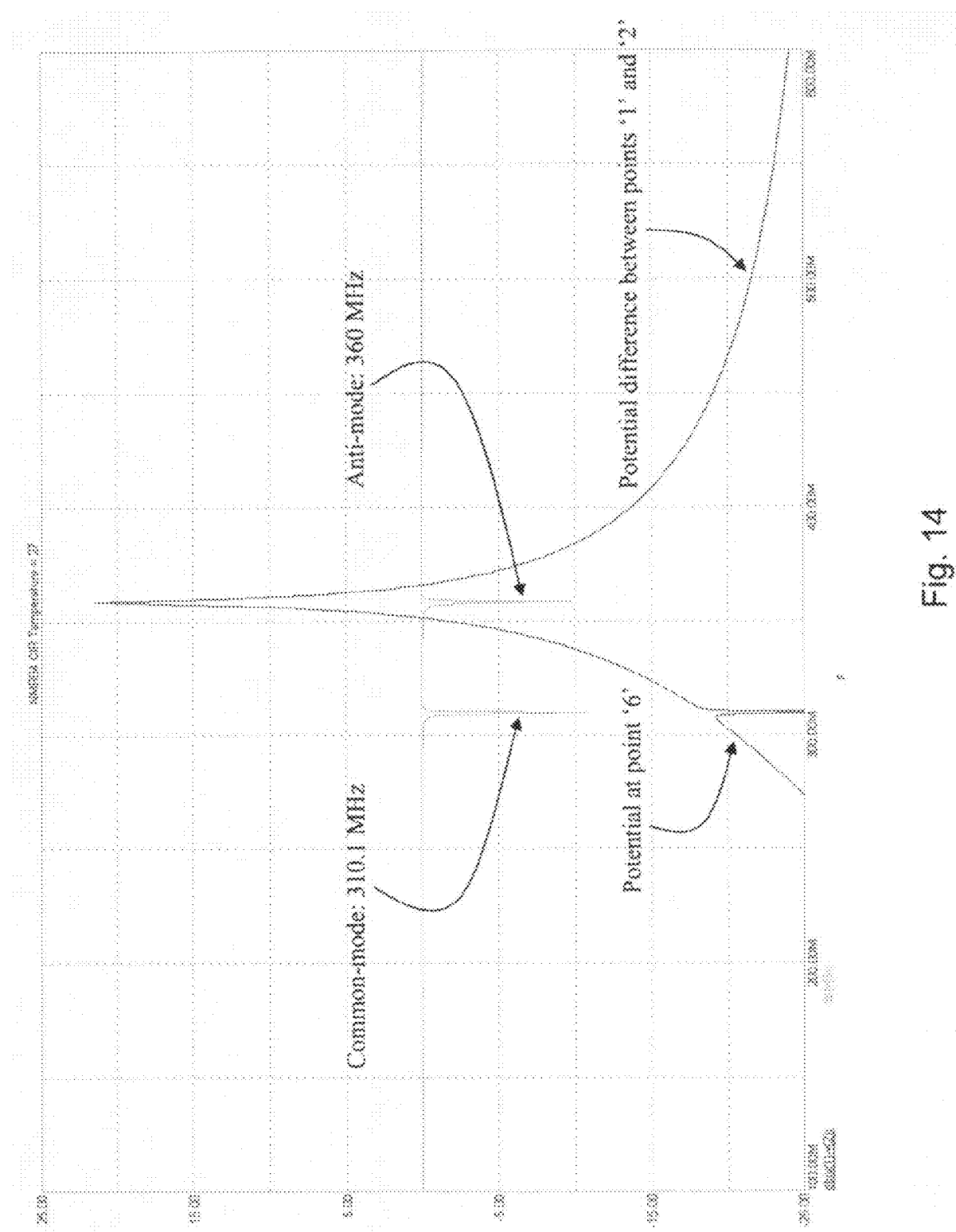
FIG. 14 shows the simulated potential and potential difference between various points in the circuit of FIG. 13, according to the present invention.

FIG. 14 show the simulated potential difference between points 1 and 2, and the potential at point 6. The RF resonator has only two current modes, referred to herein as a common-mode and an anti-mode, corresponding to resonance frequencies of 310 MHz and 360 Mhz, respectively. The desired mode frequency was selected to be the 360 Mhz mode. Both resonance frequencies are shown as voltage peaks in FIG. 14. The frequency separation between the two modes is governed by the relative values of capacitors C1, C2, C3 and C4, and by the mutual inductance between conductive elements 12.

As further demonstrated below, the physical circuit can be matched, balanced and tuned to the desired mode, using three tunable capacitors (C1, C3 and C4) and one fixed-value capacitor (C2), configured so as to eliminate the voltage drop on resistor R9, i.e., imposing a zero voltage at a point designated "A" in FIG. 13. In practice, while imaging a sample, the zero voltage at "A" minimizes transient effects on the circuit realized by muscles movements (breath, blood pulsation, etc.) of the sample, and ensures that the two halves of the circuit are balanced.

Prototype Buildup

Materials and Methods

Figure 15:
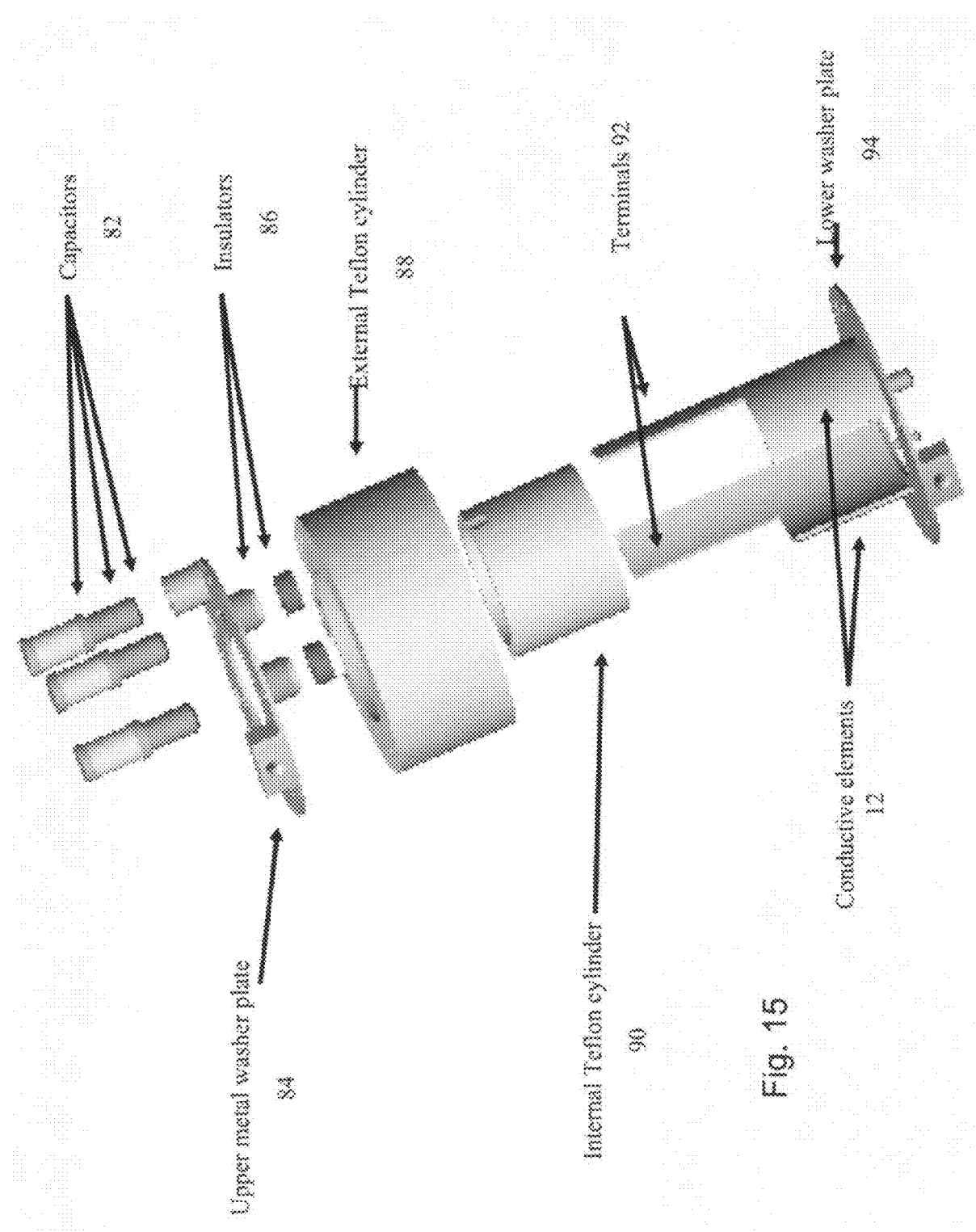
FIG. 15 is a schematic illustration of the experimental setup of the prototype linear RF resonator, according to the present invention.

Reference is now made to FIG. 15, showing the experimental setup. The prototype included two conductive elements 12, capacitors 82, an upper metal washer plate 84, a lower metal washer plate 94, insulators 86, an external cylinder 88 and an internal cylinder 90. The terminals conductive elements 12 are designated 92.

The experimental setup was build from brass sheet metal processed by machining. The external container was 53 mm in diameter, conductive elements 12 were 1 mm thick and 25 mm height and their edges were rounded. Conductive elements 12 situated along an arc, 30 mm in diameter.

All circuitry connections and capacitors were located above conductive elements 12. Metal washer plate 84 was used to screen all capacitors and connectors from the imaging volume, so as to minimize the field contribution from sources other than the conductive elements 12, and in particular the abovementioned current-loops of C3, and C4. The tunable capacitors were selected of low self resistance compared to the sample's resistive load. Thus, only small amount of power was dissipated through the C3 and C4 current-loops.

Both conductive elements 12 were connected by welding to a common ground. Terminals 92 protrude into the capacitors level through slots in upper metal washer plate 84. Conductive elements 12 were electroplated with 10 μm of silver, in order to increase conductivity within the skin depth range. The Silver layer was electroplated with a protective 1 μm layer of Gold. Most other parts of the probe were made of TEFLON™, such as the internal pipe that prevents direct contact between the sample and the conductive elements 12. Ertalon 4.6 nuts were used to fix the tunable capacitors in place. The circuit uses 3 tunable capacitors NMAP40HV purchased from Voltronics, range from 1.5 to 40 pF (C1, C3 and C4 of FIG. 13) and one chip capacitor of 2.2 pF purchased from ATM (C2 of FIG. 13). Once assembled, the circuit was tuned, matched and balanced at the resonant frequency of 360.13 MHz. Balance was achieved by imposing a zero voltage at "A".

The resonant spectrum of the experimental setup was checked by means of a spectrum analyzer and found to match the predictions of the AC simulations (see FIG. 14). Identification of the undesired common mode was performed by touching "A" with a metal instrument, thus affecting only the undesired mode while having no effect on the desired mode. When the desired mode was set to 360.13 MHz, the undesired common mode's frequency was 236.5 MHz, showing higher mutual inductance between conductive elements 12 than the original simulation estimates.

For the purpose of obtaining a full mapping of the RF magnetic field intensity, a sufficiently large phantom was selected. The phantom was a container filled with 0.075 M saline. The phantom length was more than 5 cm, which is much longer than the effective imaging volume of the RF resonator.

An unloaded of Q≈70 was estimated for the experimental setup using a small loop antenna. The extent of the sample effect on the circuit was measured by comparing the resonant frequency of the circuit with and without the phantom. As the phantom occupies the entire RF resonator void, it bears much greater resistance and capacitance than the sample which is to be imaged. The difference between the two frequencies was 0.8 MHz, which is very small once considering the circuit Q value.

Imaging Tests

A spin echo pulse sequence was chosen to for the excitation, so as to maximize the dependence of the signal intensity on the RF magnetic field. One ordinarily skilled in the art would appreciate that, as opposed, for example to a 90° pulse, such pulse substantially over estimates this dependence. Thus, the results presented herein are to be considered as bounding the quality of the prototype from below.

The uniformity of the RF magnetic field was defined as in Equation 1 hereinabove.

Figure 16A:
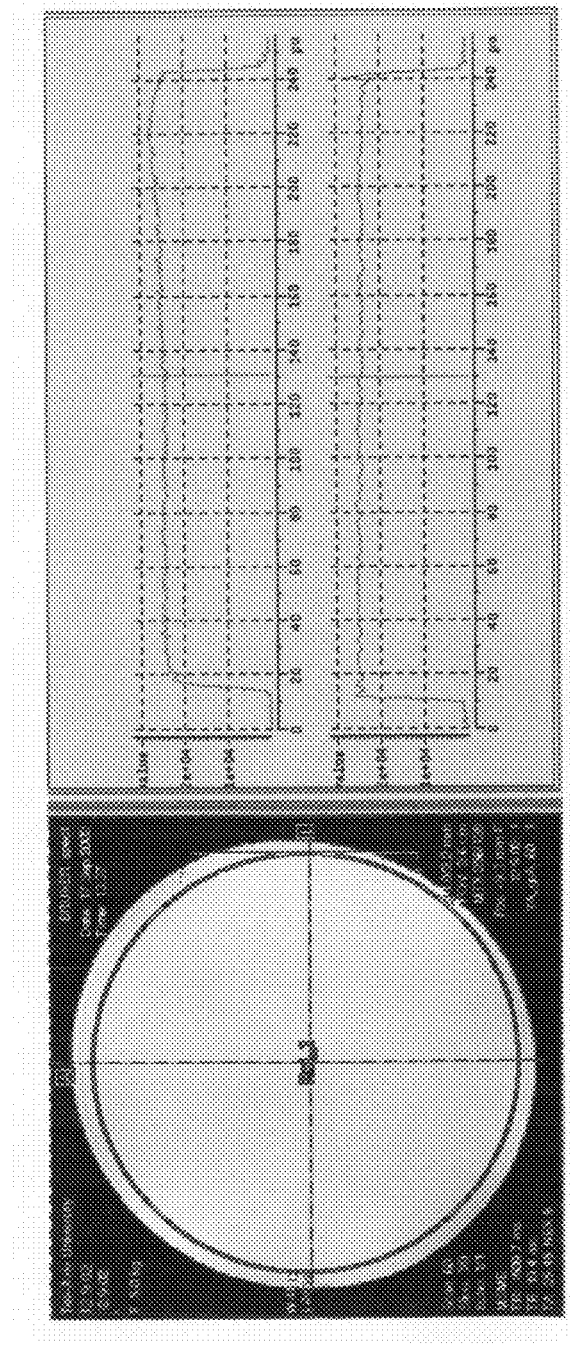
FIGS. 16a-b show profile and statistical characteristics of the RF magnetic field trough an axial slice of a phantom, imaged by the prototype linear RF resonator, according to the present invention.
Figure 16B:
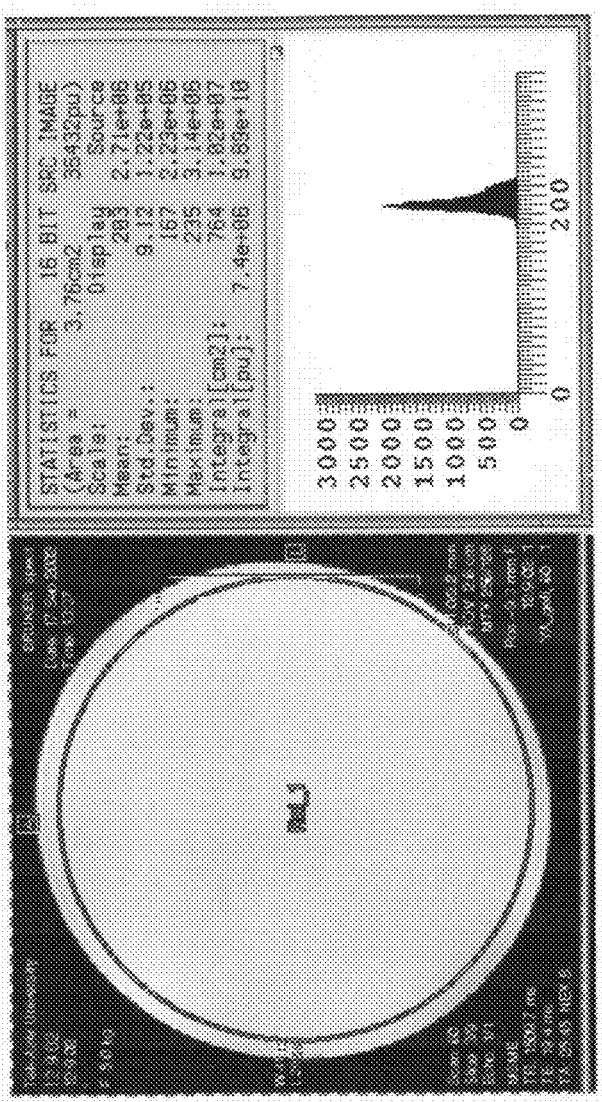

FIGS. 16a-b show the RF magnetic field profile trough an axial slice, and the one-dimensional cross sections along orthogonal directions. The yellow circle represents an area-of-interest, 22 mm in diameter, to which statistical characteristics were calculated. As opposed to the simulations of the area-of-interest, the image is more vulnerable to non-symmetrical effects. FIG. 16a shows plots of the measured magnetic field along two one-dimensional profiles, which are indicated as two perpendicular lines with respective colors within the area-of-interest. The calculated uniformity, in accordance to Equation 1, for the area-of-interest was 95%, in agreement with the uniformity calculated in the simulations. FIG. 16b shows the calculated statistical characteristics and the histogram for the area-of-interest. Generally, the RF magnetic field pattern is highly homogenous in the central areas of the coil.

Figure 17A:
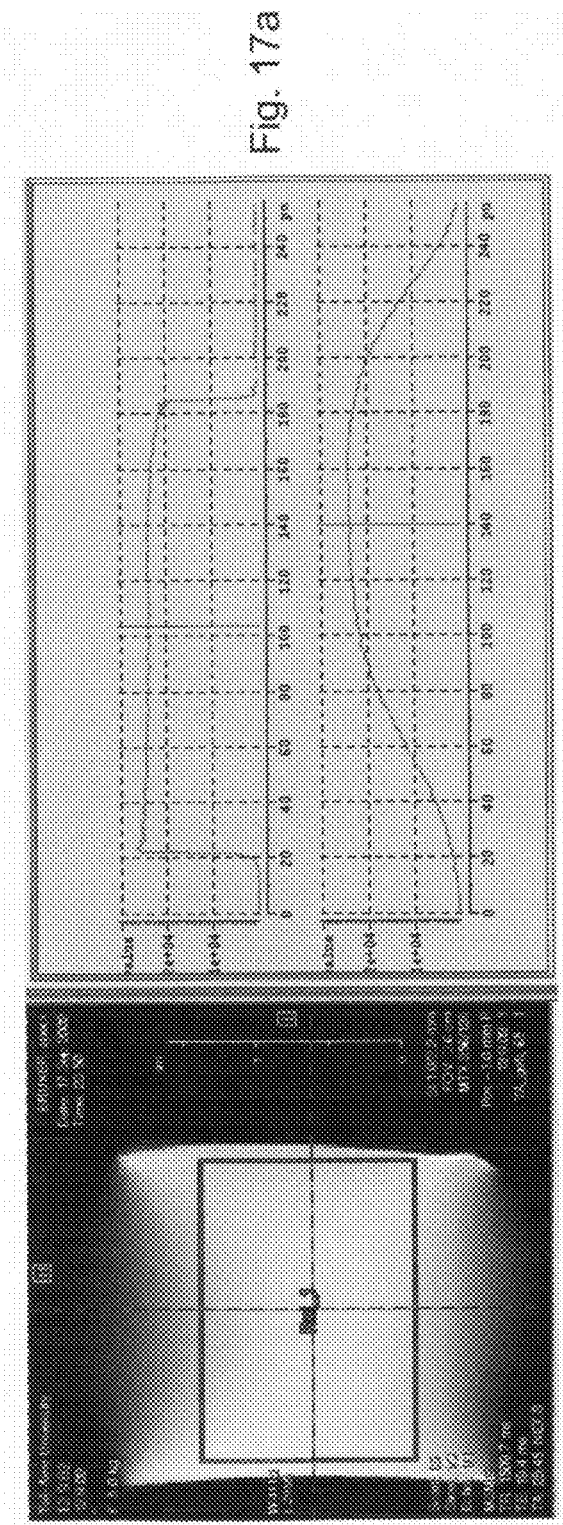
FIGS. 17a-b show profile and statistical characteristics of the RF magnetic field trough a coronal slice of a phantom, imaged by the prototype linear RF resonator, according to the present invention.
Figure 17B:
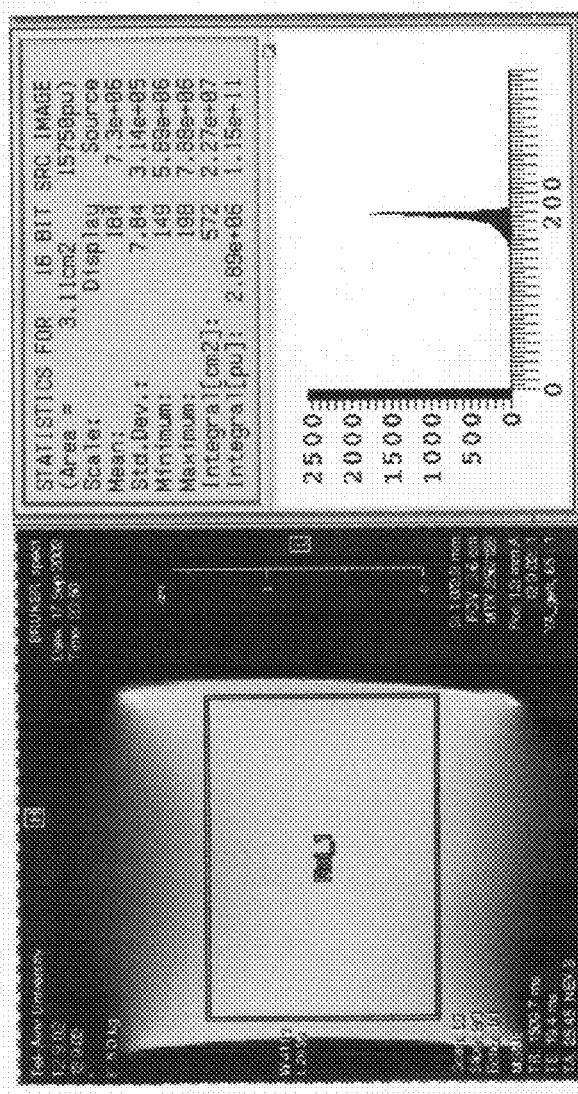

FIGS. 17a-b show the RF magnetic field profile trough a coronal slice. A yellow rectangle, 14×21 mm, represents an area-of-interest, to which statistical characteristics were calculated. FIG. 17a shows plots of the measured magnetic field along two one-dimensional profiles, which are indicated as two perpendicular lines with respective colors within the area-of-interest. FIG. 17b shows the calculated statistical characteristics and the histogram for the rectangular area-of-interest. The profile along the transverse direction is substantially homogenous in the central imaging area. The profile along the longitudinal direction shows a homogenous area in the central area of the RF resonator, with a remnant region of boundary effects near the edges.

Figure 4:
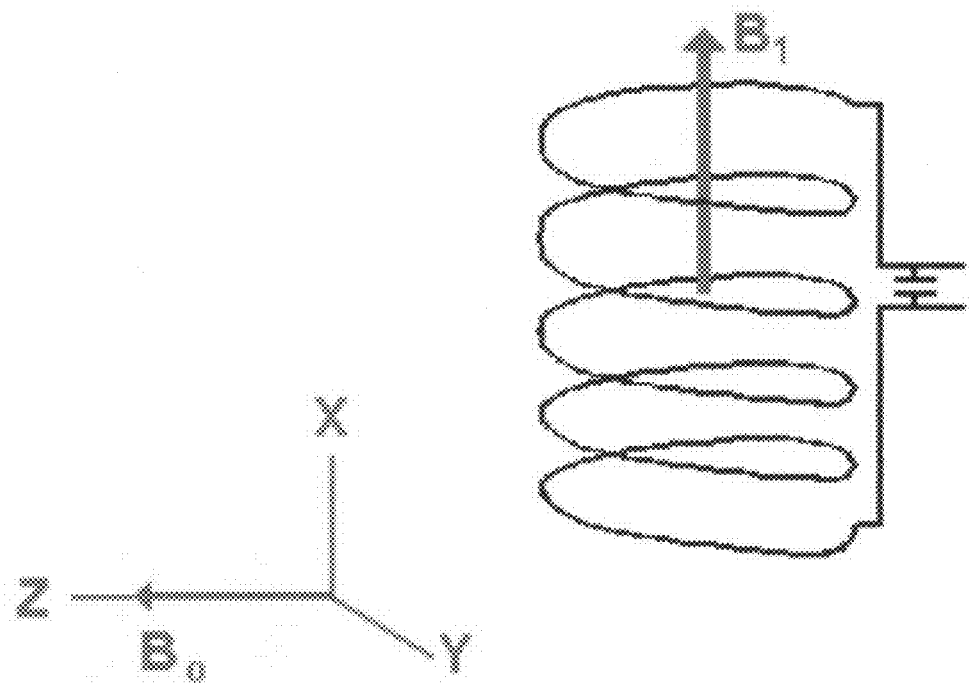
FIG. 4 is a schematic illustration of a prior art multi-turn solenoid.
Figure 5:
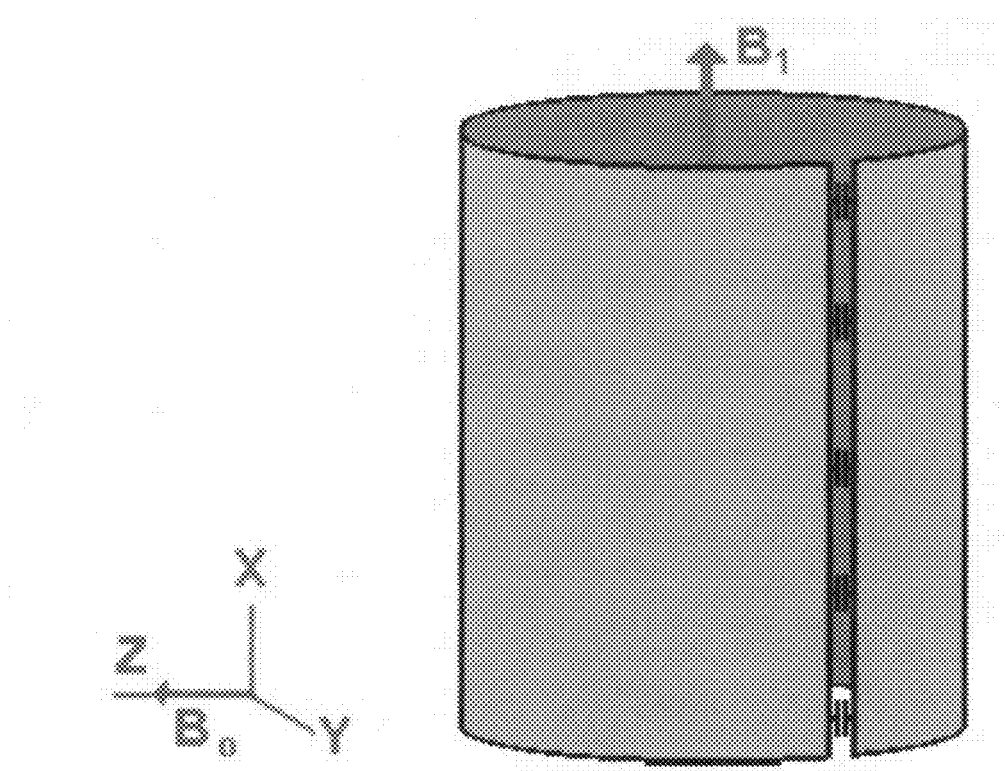
FIG. 5 is a schematic illustration of a prior art single-turn solenoid.
Figure 6:
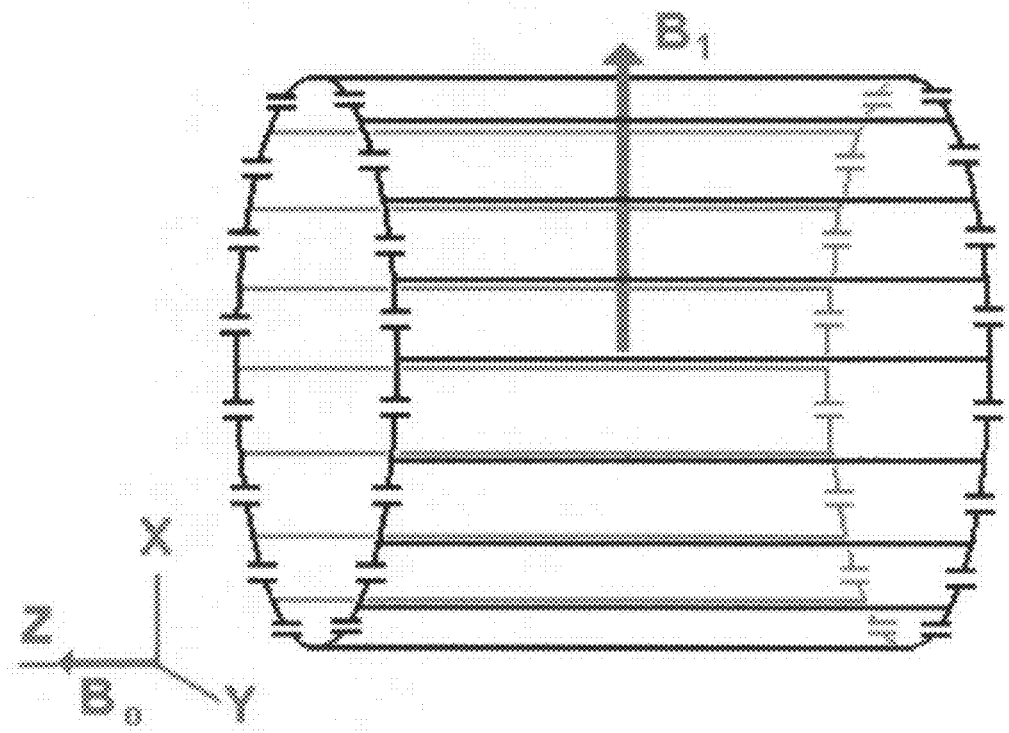
FIG. 6 is a schematic illustration of a prior art birdcage coil.
Figure 7:
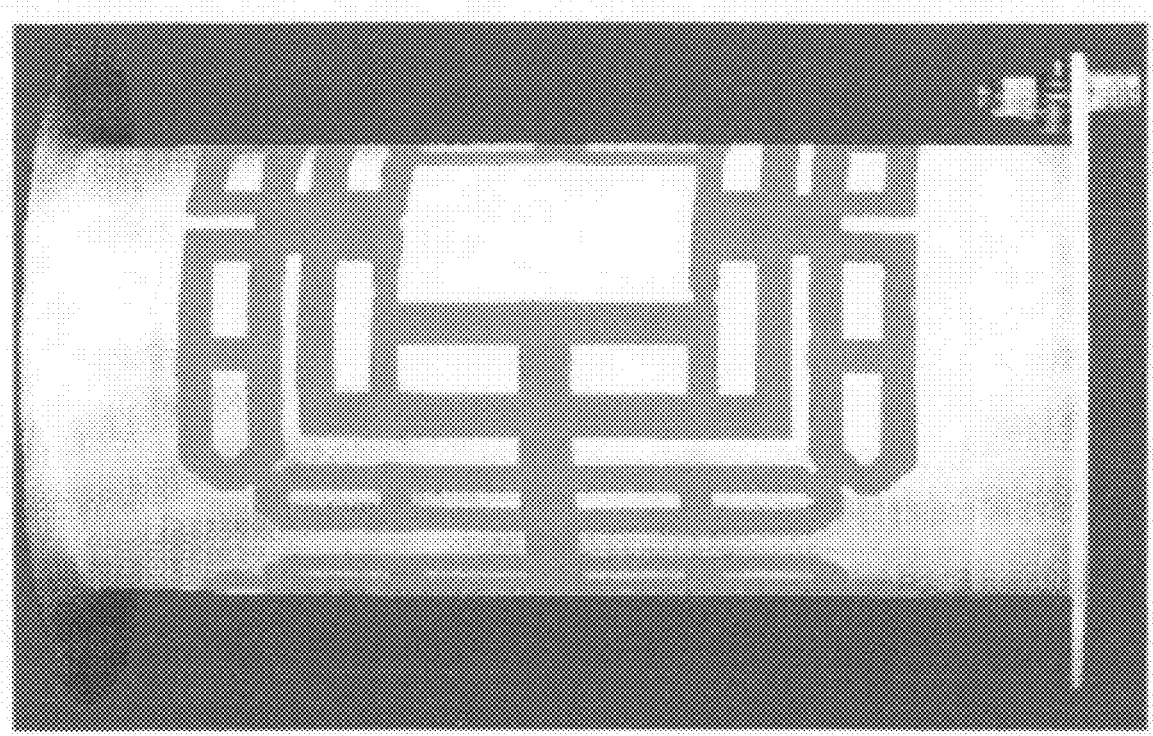
FIG. 7 is a schematic illustration of a prior art Litz coil.

Although boundary effects were detected, the calculated uniformity within the area-of-interest was 96%. The reader is advised to compare the observed boundary effects with other RF coils, e.g., the 16 legs birdcage shown in FIG. 4.20 (page 172) of the book of Jianming J. (ibid). The boundary effects in the birdcage are more pronounced, even though, in principle, the dimensions of the birdcage favor much less boundary effects due to the lower diameter-to-height ratio, as compared to the present prototype.

Figure 18A:
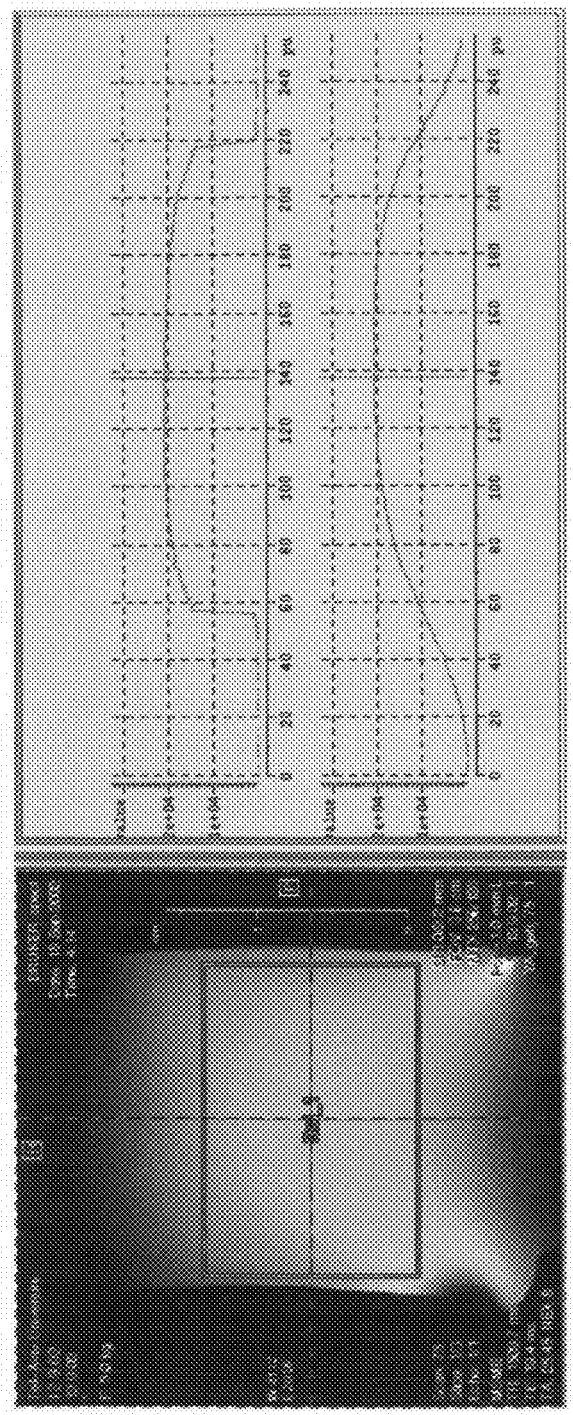
FIGS. 18a-b show profile and statistical characteristics of the RF magnetic field trough a sagittal slice of a phantom, imaged by the prototype linear RF resonator, according to the present invention.
Figure 18B:
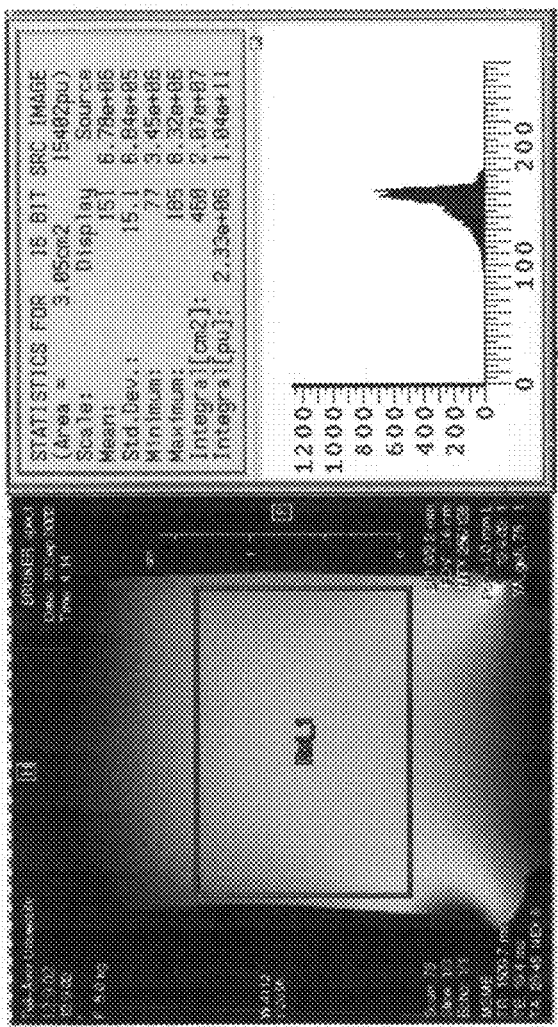
Figure 19A:
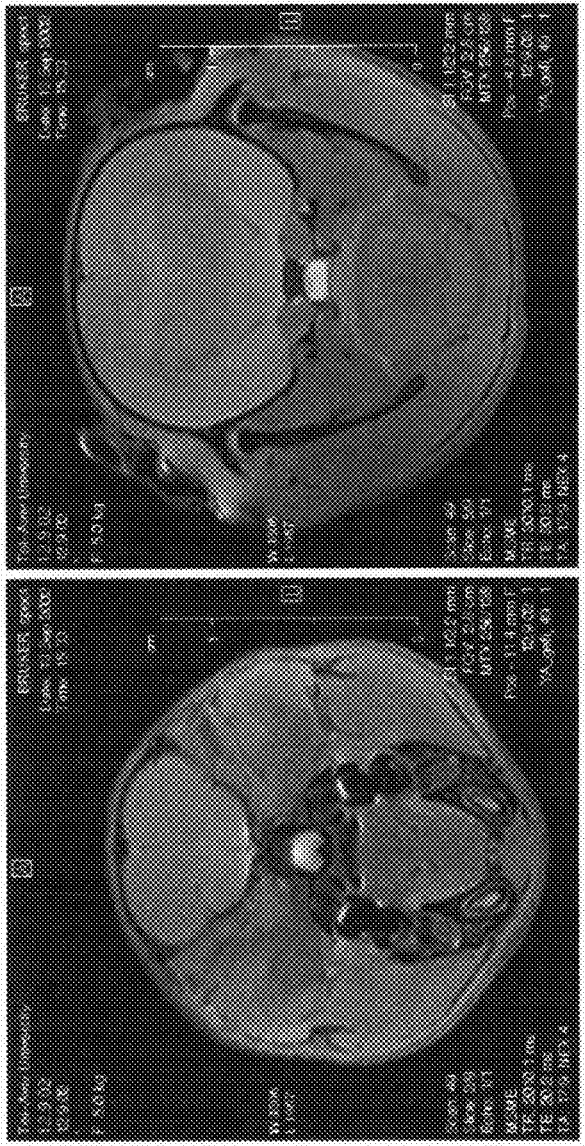
FIGS. 19a-d show axial spin echo slices in a rat head, imaged by the prototype linear RF resonator according to the present invention.
Figure 19B:
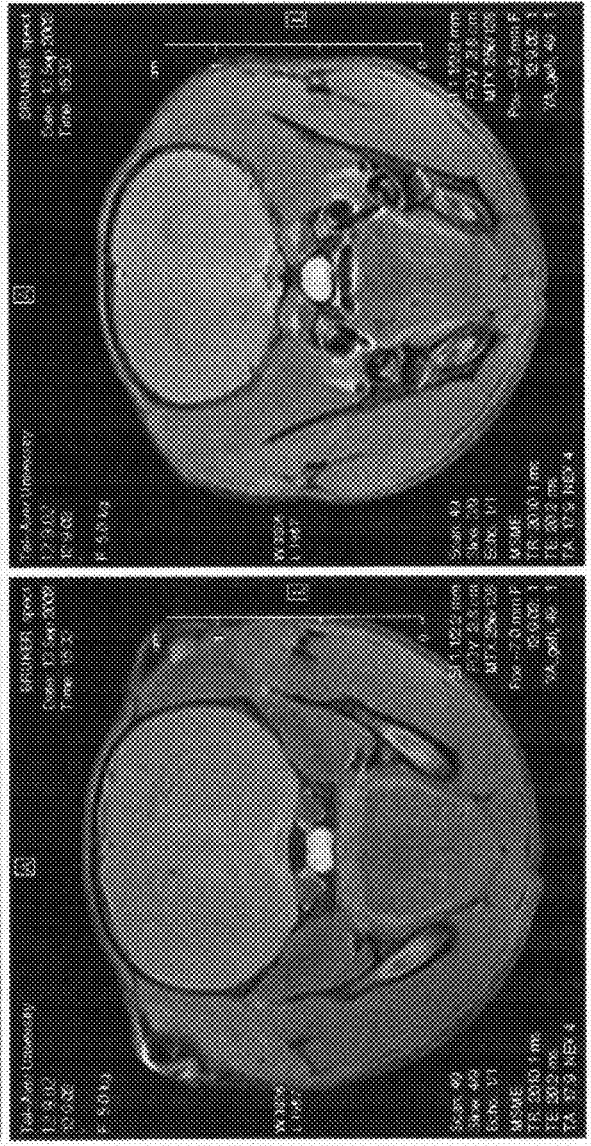
Figure 19C:
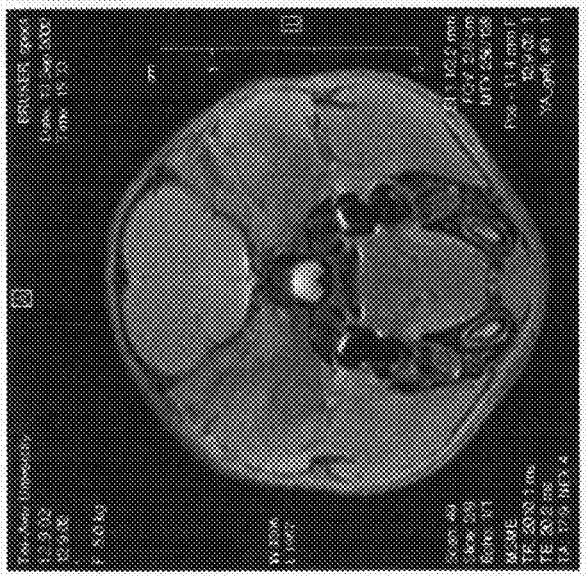
Figure 19D:
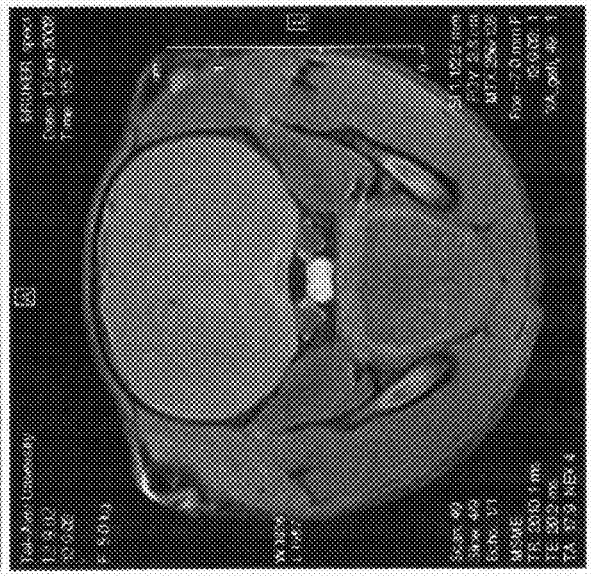

FIGS. 18a-b show the RF magnetic field profile trough a sagittal slice, within the same area-of-interest as in FIGS. 17a-b. FIG. 17a shows plots of the measured magnetic field along two one-dimensional profiles, which are indicated as two perpendicular lines with respective colors within the area-of-interest. FIG. 17b shows the calculated statistical characteristics and the histogram for the rectangular area-ofinterest. Similarly to the coronal slice, the profile along the transverse direction is substantially homogenous in the central imaging area, while a remnant region of boundary effects is observed along the longitudinal direction near the edges. The uniformity for the above rectangle of interest was 90%. The difference between the sagittal (FIGS. 18a-b) and the coronal (FIGS. 17a-b) slices uniformity is explained by the mirror symmetry of the prototype.

FIGS. 19a-d show axial spin echo slices in a rat head, using an 8.46 T wide bore magnet and utilizing fat suppression pulses. Each slice thickness was 1 mm. The quality of the image is vivid.

Example 2

A Quadrature RF Resonator

Following is a description of a quadrature RF resonator designed as two decoupled linear RF resonators.

Reference is now made to FIG. 20 illustrating a top view of the quadrature RF resonator of this example. The quadrature resonator of this example includes four conductive elements arranged as two pairs, designated 12 and 12a. Pair 12 and pair 12a are positioned so that the respective symmetry axes are perpendicular to each other. Antiparallel currents 16 are driven through pair 12 and pair 12a, where, according to the common convention, current which is outgoing downwards (into the plane of FIG. 20) is designated by the cross symbol and current which is incoming upwards is designated by the dot symbol. Currents 16 are driven by a split phase RF source, so that the voltage on pair 12 is shifted by 90° with respect to the voltage on pair 12a.

Currents 16 generate magnetic field in and outside the volume surrounded by the conductive elements. The characteristics of the magnetic field generated by pair 12 on the surface of pair 12a may be better understood by considering two points, designated G and F, located on opposite sides of one conductive element of pair 12a, which point are symmetrical with respect to the pair 12. The magnetic field at G and F is identical in amplitude and opposite in sign, due to the opposite direction of the currents near each point. One ordinarily skilled in the art would appreciate that similar consideration apply for each two symmetrical located pair of points along one conductive element of pair 12a. Thus, the magnetic field on the surface of each conductive element of pair 12a is antisymmetric with respect to a symmetry axis of the surface.

Reference is now made to FIG. 21 which shows the electrical currents induced onto the surfaces of pair 12a, due to changes in magnetic flux therethrough. At each point of points F and G, the induced current is opposite in direction to that of the conductive element of pair 12 which is close to it. Therefore, the effect of pair 12 on pair 12a is the induction of current loops by on the surface pair 12a.

However, although current loops do exist on pair 12a, the total net current induce by pair 12 on pair 12a, is zero, thereby ensuring that pair 12a is decoupled from pair 12. A skilled artisan would appreciate that such decoupling may be achieved, for different geometries of the surfaces, provided that each conductive element is symmetrical, and that two pairs are perpendicularly positioned (e.g., as in FIG. 20).

The driven currents flowing through pair 12a generate an induced magnetic field directed opposite to the direction of the magnetic field generated by pair 12. Hence, even though no electric/magnetic conjugation exists between the pairs, pair 12a changes the field pattern generated by pair 12. Specifically the use of pair 12a in addition to pair 12, under a phase shift condition which is supplied by the split phase RF source, ensures that the RF magnetic field is substantially circularly polarized.

The magnetic field pattern of the quadrature RF resonator of the present example was simulated utilizing the same technique that was used for the determination of the linear RF resonator of Example 1. In the simulations, the contribution of pair 12a to the magnetic field was calculated by representing the conductive elements of pair 12a as surfaces of zero magnetic field. The justification for this representation is related to the observation that due to its short wavelength, the RF field cannot percolates through a conductive element whose width is larger than many skin depths.

As stated the simulation is conducted using the near-field approximation, hence, pair 12a is represented by zero-potential surfaces, while the pair 12, is represented by a finite potential surface. The voltage configuration of the quadrature RF resonator is shown in FIG. 22.

Figure 23A:
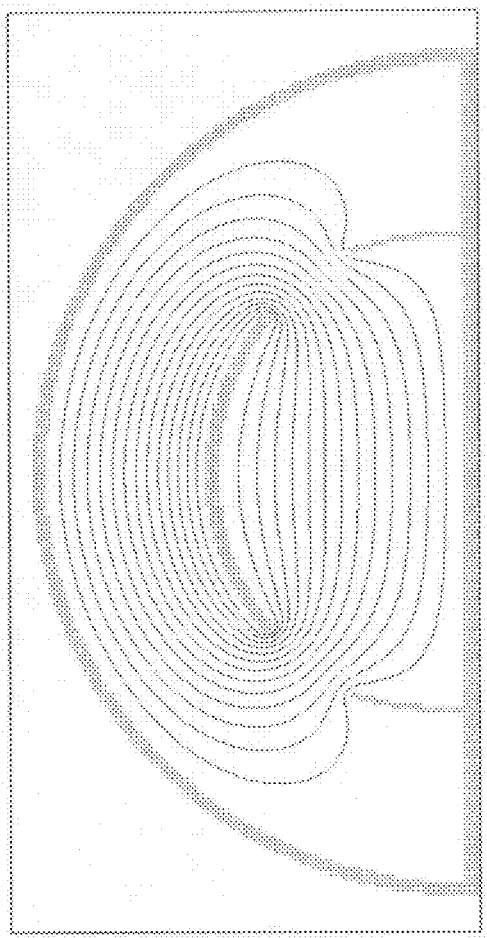
FIG. 23a shows calculated electric potential of the quadrature RF resonator, according to the present invention.
Figure 23B:
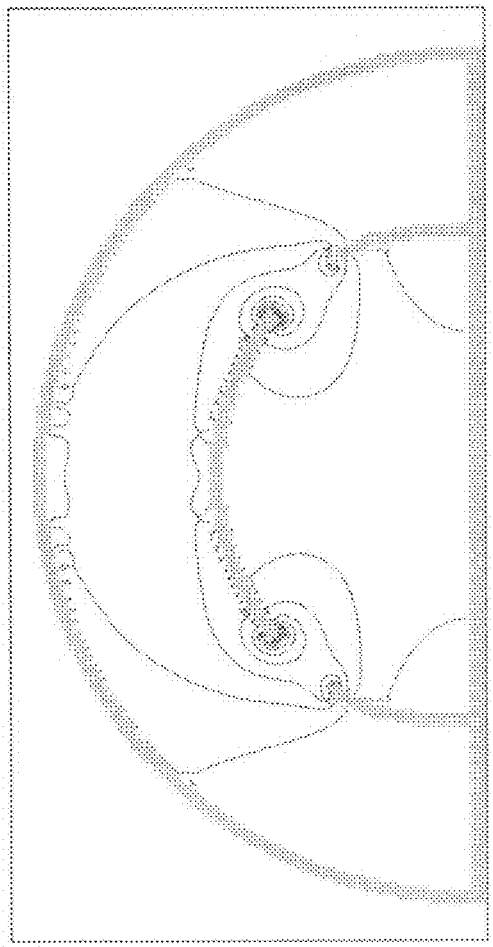
FIG. 23b shows calculated electric potential and electric field of the quadrature RF resonator, according to the present invention.

Reference is now made to FIGS. 23a-b, showing the simulation results. FIG. 23a shows the calculated electric potential and FIG. 23b shows the calculated electric field. As can be seen, a considerable homogenous area with a substantially zero gradient was observed in the central region of the quadrature RF resonator.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A radiofrequency (RF) resonator for magnetic resonance analysis, the RF resonator comprising:

(a) at least two conductive elements, each having a first curvature along a direction perpendicular to a longitudinal axis, said at least two conductive elements being spaced along said longitudinal axis to define a volume between said at least two conductive elements, wherein said at least two conductive elements are characterized by an RF shield structure for substantially blocking RF radiation while transmitting low frequency radiation, and wherein an RF current flowing within said at least two conductive elements in a direction of said longitudinal axis induces in said volume a substantially homogenous RF magnetic field directed perpendicular to said longitudinal axis; and (b) at least one additional conductive element, electrically communicating with said at least two conductive elements in a manner such that a phase of an RF current flowing through said at least one additional conductive element equals a phase of at least one of said RF currents flowing through said at least two conductive elements.

2. The RF resonator of claim 1, further comprising an electronic circuitry designed and configured for providing predetermined resonance characteristics of the RF resonator, for matching an impedance of the RF resonator to an impedance of an RF transmitter electrically communicating with said electronic circuitry, and for balancing said RF magnetic field to have a substantially symmetrical profile with respect to a transverse axis being perpendicular to said longitudinal axis.

3. The RF resonator of claim 1, wherein said at least one additional conductive element is a plurality of additional conductive elements, shaped as rods and being arranged at a circumference of said volume.

4. The RF resonator of claim 1, wherein an RF current flowing through said at least one additional conductive element depends on said RF currents flowing through said at least two conductive elements, through a predetermined function.

5. The RF resonator of claim 4, wherein said predetermined function is selected from the group consisting of a linear function, a polynomial function, an exponential function, a rational function, a power function and any combination thereof.

6. The RF resonator of claim 1, wherein an RF current flowing through said at least one additional conductive element is a predetermined fraction of said RF currents flowing through said at least two conductive elements.

7. The RF resonator of claim 6, wherein said predetermined fraction is one half.

8. An apparatus for magnetic resonance analysis, the apparatus comprising:
(a) a device for providing a static magnetic field;
(b) a processing unit; and
(c) a radiofrequency (RF) resonator coupled to an RF transmitter, said RF resonator comprising:
at least two conductive elements, each having a first curvature along a direction perpendicular to a longitudinal axis, said at least two conductive elements being spaced along said longitudinal axis to define a volume between said at least two conductive elements, wherein said at least two conductive elements are characterized by an RF shield structure for substantially blocking RF radiation while transmitting low frequency radiation, and wherein an RF current flowing within said at least two conductive elements in a direction of said longitudinal axis induces in said volume a substantially homogenous RF magnetic field, directed perpendicular to said longitudinal axis; and
at least one additional conductive element, electrically communicating with said at least two conductive elements in a manner such that a phase of an RF current flowing through said at least one additional conductive element equals a phase of at least one of said RF currents flowing through said at least two conductive elements.

9. The apparatus of claim 8, wherein said RF resonator further comprising an electronic circuitry designed and configured for providing predetermined resonance characteristics of said RF resonator, for matching an impedance of said RF resonator to an impedance of said RF transmitter, and for balancing said RF magnetic field to have a substantially symmetrical profile with respect to a transverse axis being perpendicular to said longitudinal axis.

10. The apparatus of claim 9, wherein said electronic circuitry comprises means for varying mutual capacitance.

11. The apparatus of claim 9, wherein said electronic circuitry comprises means for varying mutual inductance.

12. The apparatus of claim 11, wherein said mutual inductance is defined between said RF resonator and said RF transmitter.

13. The apparatus of claim 11, wherein said mutual inductance is defined between said electronic circuitry and said RF transmitter.

14. The apparatus of claim 9, wherein said RF resonator further comprising a balancing adjuster electrically communicating with said electronic circuitry, said balancing adjuster is constructed and designed for controlling said electronic circuitry while said RF resonator is in medical use.

15. The apparatus of claim 8, wherein said device for providing said static magnetic field comprises at least one shim coil.

16. The apparatus of claim 8, further comprising at least one gradient coil.

17. The apparatus of claim 16, further comprising decoupling means for decoupling said RF resonator from said at least one gradient coil.

18. The apparatus of claim 8, further comprising at least one end-cap positioned adjacent to at least one end of said RF resonator, said at least one end-cap constructed and designed for minimizing magnetic field inhomogeneities along said longitudinal axis.

19. The apparatus of claim 8, wherein a longitudinal dimension of said at least two conductive elements is selected so as to minimize magnetic field inhomogeneities along said longitudinal axis.

20. The apparatus of claim 8, wherein a separation between said at least two conductive elements is selected so as to surround an object to be imaged.

21. The apparatus of claim 20, wherein said object is a mammal, an organ of a mammal, a tissue, a swollen elastomer, a food material, a liquid, and at least one type of molecules present in the solvent.

22. The apparatus of claim 8, wherein at least one of said at least two conductive elements further has a second curvature along a direction parallel to said longitudinal axis.

23. The apparatus of claim 8, wherein a number of said at least two conductive elements is selected so that said substantially homogenous RF magnetic field is linearly polarized.

24. The apparatus of claim 8, wherein a number of said at least two conductive elements is selected so that said substantially homogenous RF magnetic field is substantially circularly polarized.

25. The apparatus of claim 8, wherein said at least two conductive elements are two conductive elements.

26. The apparatus of claim 8, wherein said at least two conductive elements are four conductive elements.

27. The apparatus of claim 26, wherein a first pair of said four conductive elements is magnetically decoupled from a second pair of said four conductive elements.

28. The apparatus of claim 26, wherein a first pair of said four conductive elements is electrically decoupled from a second pair of said four conductive elements.

29. The apparatus of claim 26, wherein a first pair of said four conductive elements is electromagnetically decoupled from a second pair of said four conductive elements.

30. The apparatus of claim 26, wherein a first pair and a second pair of said four conductive elements are positioned so that a transverse axis of said first pair is substantially perpendicular to a transverse axis of said second pair.

31. The apparatus of claim 26, wherein a first pair of said four conductive elements is electrically decoupled from a second pair of said four conductive elements.

32. The apparatus of claim 8, wherein said at least two conductive elements are made of a superconducting material.

33. The apparatus of claim 32, further comprising means for preserving said at least two conductive elements at a sufficiently low temperature.

34. The apparatus of claim 32, further comprising at least one additional RF resonator arranged with said RF resonator to form an RF resonator array.

35. The apparatus of claim 34, further comprising decoupling means for decoupling said RF resonator from said at least one additional RF resonator.

36. The apparatus of claim 34, wherein said array is a phased array.

37. The apparatus of claim 32, wherein said RF resonator is a multi frequency RF resonator.

38. The apparatus of claim 32, wherein each of said at least two conductive elements has a predetermined capacitance distribution for minimizing effects of an object to be imaged on said magnetic field and for minimizing corona discharge from said at least two conductive elements.

39. The apparatus of claim 8, wherein said at least two conductive elements are designed and constructed to minimize eddy currents generated therein.

* * * * *